US012796234B2

(12) United States Patent
Li et al.

(10) Patent No.: US 12,796,234 B2
(45) Date of Patent: Nov. 10, 2026

(54) DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Shuo Li, Beijing (CN); Ling Shi, Beijing (CN); Youchun Chen, Beijing (CN); Yanyang Shang, Beijing (CN); Changchang Liu, Beijing (CN); Zhenglong Yan, Beijing (CN)

(73) Assignees: CHENGDU BOE OPTOELECTRONICS TECHNOLOGY CO., LTD., Chengdu (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 333 days.

(21) Appl. No.: 18/713,205

(22) PCT Filed: Nov. 29, 2022

(86) PCT No.: PCT/CN2022/135049

§ 371 (c)(1),
(2) Date: May 24, 2024

(87) PCT Pub. No.: WO2024/113163

PCT Pub. Date: Jun. 6, 2024

(65) Prior Publication Data

US 2026/0182235 A1 Jun. 25, 2026

(51) Int. Cl.
*H10K 59/122* (2023.01)
*G09G 3/3233* (2016.01)
(Continued)

(52) U.S. Cl.
CPC ......... *H10K 59/122* (2023.02); *G09G 3/3233* (2013.01); *H10D 86/60* (2025.01); *H10K 59/123* (2023.02); *H10K 71/00* (2023.02)

(58) Field of Classification Search
CPC .... G09G 3/3233; G09G 3/3275; H10D 86/60; H10K 59/122; H10K 59/123;
(Continued)

(56) References Cited

U.S. PATENT DOCUMENTS

2016/0329393 A1* 11/2016 Seo ...................... G09G 3/2022
2020/0193917 A1 6/2020 Park et al.

FOREIGN PATENT DOCUMENTS

CN 113053982 A 6/2021
CN 113327947 A 8/2021
(Continued)

OTHER PUBLICATIONS

Extended European Search Report of application No. 22966761.3 dated Jun. 3, 2025.

(Continued)

*Primary Examiner* — Cheung Lee
(74) *Attorney, Agent, or Firm* — Calfee, Halter & Griswold LLP

(57) ABSTRACT

A display panel and a display device are provided. The display panel includes a base substrate, a first source-drain layer, a second source-drain layer, an electrode layer, and a pixel definition layer. The first source-drain layer is provided on the base substrate and includes a data line, the second source-drain layer is provided on the first source-drain layer and includes a power line, the electrode layer is provided on the second source-drain layer and includes electrode parts, and the pixel definition layer is provided on the electrode layer and has pixel openings. The pixel opening is provided in correspondence with the electrode part. An orthographic projection of the pixel opening on the base substrate coincides with that of the electrode part. The orthographic
(Continued)

projections of at least some of the electrode parts on the base substrate are at least partially overlapped with that of the data line.

20 Claims, 22 Drawing Sheets

(51) Int. Cl.
*H10D 86/60* (2025.01)
*H10K 59/123* (2023.01)
*H10K 71/00* (2023.01)

(58) Field of Classification Search
CPC .... H10K 59/131; H10K 59/17; H10K 59/173; H10K 59/179; H10K 59/30; H10K 59/35; H10K 59/80; H10K 59/805; H10K 71/00
See application file for complete search history.

(56) References Cited

FOREIGN PATENT DOCUMENTS

| | | | |
|---|---|---|---|
| CN | 114679914 | A | 6/2022 |
| CN | 216818344 | U | 6/2022 |
| KR | 20190103540 | A | 9/2019 |
| WO | 2022198573 | A1 | 9/2022 |

OTHER PUBLICATIONS

International Search Report of PCT application No. PCT/CN2022/135049 dated Jul. 28, 2023.
Written Opinion of PCT application No. PCT/CN2022/135049 dated Jul. 28, 2023.

* cited by examiner

DISPLAY PANEL AND DISPLAY DEVICE

CROSS-REFERENCE TO RELATED APPLICATIONS

The present application is a U.S. National Stage of International Application No. PCT/CN2022/135049 filed on Nov. 29, 2022, the entire contents of which are incorporated herein by reference.

TECHNICAL FIELD

The present disclosure relates to the field of display technology, and specifically, to a display panel and a display device.

BACKGROUND

In the related technology, the flatness of the electrode part of the light emitting unit in the display panel is poor.

It is to be noted that the information disclosed in the above background section is only used to enhance the understanding of the background of the present disclosure, and thus may include information that does not constitute the prior art known to those skilled in the art.

SUMMARY

An aspect of the present disclosure provides a display panel, including: a base substrate; a first source-drain layer, provided on a side of the base substrate and including a data line; a second source-drain layer, provided on a side of the first source-drain layer away from the base substrate and including a power line; an electrode layer, provided on a side of the second source-drain layer away from the base substrate and including a plurality of electrode parts; and a pixel definition layer, provided on a side of the electrode layer away from the base substrate and having a plurality of pixel openings formed therein, the pixel opening being provided in correspondence with the electrode part, and an orthographic projection of the pixel opening on the base substrate coinciding with an orthographic projection of the electrode part on the base substrate, wherein the orthographic projections of at least some of the plurality of the electrode parts on the base substrate are at least partially overlapped with an orthographic projection of the data line on the base substrate.

In an exemplary embodiment of the present disclosure, the display panel further includes: a first planarization layer, provided between the first source-drain layer and the second source-drain layer; and a second planarization layer, provided between the second source-drain layer and the electrode layer.

In an exemplary embodiment of the present disclosure, the display panel further includes a green light emitting unit, the plurality of electrode parts include a first electrode part configured to form a first electrode of the green light emitting unit, and an orthographic projection of the first electrode part on the base substrate is at least partially overlapped with the orthographic projection of the data line on the base substrate.

In an exemplary embodiment of the present disclosure, the display panel further includes a blue light emitting unit and a red light emitting unit, and the electrode layer further includes: a second electrode part, configured to form a first electrode of the blue light emitting unit, an orthographic projection of the second electrode part on the base substrate falling on an orthographic projection of the power line on the base substrate; and a third electrode part, configured to form a first electrode of the red light emitting unit, an orthographic projection of the third electrode part on the base substrate falling on the orthographic projection of the power line on the base substrate.

In an exemplary embodiment of the present disclosure, the display panel further includes a green light emitting unit, a blue light emitting unit, and a red light emitting unit, and the plurality of electrode parts includes: a first electrode part, configured to form a first electrode of the green light emitting unit, an orthographic projection of the first electrode part on the base substrate falling on an orthographic projection of the power line on the base substrate; a second electrode part, configured to form a first electrode of the blue light emitting unit, an orthographic projection of the second electrode part on the base substrate being at least partially overlapped with an orthographic projection of the data line on the base substrate; and a third electrode part, configured to form a first electrode of the red light emitting unit, an orthographic projection of the third electrode part on the base substrate being at least partially overlapped with the orthographic projection of the data line on the base substrate.

In an exemplary embodiment of the present disclosure, the display panel includes a plurality of repetition units arranged in an array in a first direction and a second direction intersection with the first direction, and the repetition unit includes two pixel driving circuits arranged in the first direction, and the two pixel driving circuits in a same repetition unit are provided in mirror symmetry.

In an exemplary embodiment of the present disclosure, the pixel driving circuit includes a driving transistor and a fifth transistor, and a second electrode of the fifth transistor is connected to a first electrode of the driving transistor, the first source-drain layer further includes: a first bridging part, connected to a first electrode of the fifth transistor and connected to the power line through a via hole, and in pixel driving circuits provided in different repetition units and adjacent in the first direction, the orthographic projection of the data line on the base substrate is located between orthographic projections of two adjacent first bridging parts on the base substrate.

In an exemplary embodiment of the present disclosure, the orthographic projection of the data line on the base substrate extends in the second direction, the data line includes a first extension part, a second extension part and a third extension part, and the second extension part is connected between the first extension part and the third extension part; in pixel driving circuits located in different repetition units and adjacent in the first direction, the first extension parts of two adjacent data lines are provided opposite each other in the first direction, the second extension parts of the two adjacent data lines are provided opposite each other in the first direction, and the third extension parts of the two adjacent data lines are provided opposite each other in the first direction; a distance, in the first direction, between orthographic projections of two adjacent second extension parts on the base substrate is greater than a distance, in the first direction, between orthographic projections of two adjacent first extension parts on the base substrate; and the distance, in the first direction, between the orthographic projections of the two adjacent second extension parts on the base substrate is greater than a distance, in the first direction, between orthographic projections of two adjacent third extension parts on the base substrate.

In an exemplary embodiment of the present disclosure, the pixel driving circuit further includes a driving transistor, a second transistor, a fourth transistor, a first electrode of the second transistor is connected to a gate electrode of the driving transistor, a second electrode of the second transistor is connected to a second electrode of the driving transistor, a first electrode of the fourth transistor is connected to the data line, and a second electrode of the fourth transistor is connecting to a first electrode of the driving transistor, and the display panel further includes: a first gate line, an orthographic projection of the first gate line on the base substrate extending in the first direction, and a portion of the first gate line being configured to form a gate electrode of the second transistor; and a second gate line, an orthographic projection of the second gate line on the base substrate extending in the first direction, and a portion of the second gate line being configured to form a gate electrode of the fourth transistor. An orthographic projection of a portion of the second extension part on the base substrate is located between an orthographic projection of the first gate line on the base substrate and an orthographic projection of the second gate line on the base substrate.

In an exemplary embodiment of the present disclosure, the pixel definition layer is a black pixel definition layer, the pixel definition layer is further provided with a light-transmitting hole, the light-transmitting hole is provided in a light-transmitting area of the display panel and is provided in the pixel driving circuits of different repetition units and adjacent to each other in the first direction, and an orthographic projection of at least a portion of the light-transmitting hole on the base substrate is located between the orthographic projections of the two adjacent second extension parts on the base substrate, and is located between the orthographic projection of the first gate line on the base substrate and the orthographic projection of the second gate line on the base substrate.

In an exemplary embodiment of the present disclosure, the first direction is a row direction, the second direction is a column direction, and the pixel driving circuits in each column are provided corresponding to one power line, and an orthographic projection of the power line on the base substrate extends in the column direction, the power line includes a fourth extension part, a fifth extension part, a sixth extension part, and the fifth extension part is connected between the fourth extension part and the sixth extension part, a size, in the row direction, of an orthographic projection of the fifth extension part on the base substrate is greater than a size, in the row direction, of an orthographic projection of the fourth extension part on the base substrate, and is greater than a size, in the row direction, of an orthographic projection of the sixth extension part on the base substrate, in the same repetition unit, the extension parts of two adjacent power lines are connected to each other, and two connected fifth extension parts form a conductive block, and orthographic projections of at least some of the plurality of electrode parts on the base substrate are overlapped with the orthographic projection of the power line on the base substrate, and the orthographic projection of the electrode part, overlapped with the power line, on the base substrate falls on an orthographic projection of the conductive block on the base substrate.

In an exemplary embodiment of the present disclosure, the display panel further includes a pixel driving circuit and a light emitting unit, the pixel driving circuit is configured to drive the light emitting unit to emit light, the pixel driving circuit includes a driving transistor, a capacitor, a first electrode of the capacitor is connected to a gate electrode of the driving transistor, and a second electrode of the capacitor is connected to the power line, the light emitting unit includes a red light emitting unit, a green light emitting unit, and a blue light emitting unit, a capacitance of the capacitor in the pixel driving circuit corresponding to the green light emitting unit is smaller than a capacitance of the capacitor in the pixel driving circuit corresponding to the blue light emitting unit, and the capacitance of the capacitor in the pixel driving circuit corresponding to the green light emitting unit is smaller than a capacitance of the capacitor in the pixel driving circuit corresponding to the red light emitting unit.

In an exemplary embodiment of the present disclosure, the pixel driving circuit further includes a second transistor, and a first electrode of the second transistor is connected to the gate electrode of the driving transistor, the display panel further includes: a first gate layer, provided between the base substrate and the first source-drain layer, and including a first conductive part, the first conductive part being configured to form the first electrode of the capacitor and the gate electrode of the driving transistor; and a second gate layer, provided between the first gate layer and the first source-drain layer, and including a second conductive part, an orthographic projection of the second conductive part on the base substrate being at least partially overlapped with an orthographic projection of the first conductive part on the base substrate, and the second conductive part being configured to form the second electrode of the capacitor, wherein a first opening is formed in the second conductive part, the first source-drain layer further includes: a second bridging part, connected to the first electrode of the second transistor, and connected to the first conductive part through a via hole passing through the first opening, wherein an area of an orthographic projection, on the base substrate, of the first opening in the pixel driving circuit corresponding to the green light emitting unit is greater than an area of an orthographic projection, on the base substrate, of the first opening in the pixel driving circuit corresponding to the red light emitting unit, the area of the orthographic projection, on the base substrate, of the first opening in the pixel driving circuit corresponding to the green light emitting unit is greater than an area of an orthographic projection, on the base substrate, of the first opening in the pixel driving circuit corresponding to the blue light emitting unit.

In an exemplary embodiment of the present disclosure, the display panel further includes: a light emitting unit layer, provided on a side of the pixel definition layer away from the base substrate, and including a plurality of light emitting units; and a color film layer, provided on a side of the light emitting unit layer away from the base substrate, and including a plurality of color filtering parts, the color filtering part being provided in correspondence with the electrode part, and an orthographic projection of the color filtering part on the base substrate being at least partially overlapped with an orthographic projection of a corresponding electrode part on the base substrate.

In an exemplary embodiment of the present disclosure, the display panel further includes a pixel driving circuit, the pixel driving circuit includes a driving transistor and a first transistor, a second electrode of the first transistor is connected to a gate electrode of the driving transistor, and a first electrode of the first transistor is connected to a first initial signal line, the display panel further includes: a first gate layer; a second active layer; and a second gate layer, provided between the first gate layer and the second active layer, and including the first initial signal line, an orthographic projection of the first initial signal line on the base substrate extending in a first direction, the first source-drain layer further includes a first initial connection line, and an orthographic projection of the first initial connection line on the base substrate extends in a second direction intersecting the first direction, the first initial connection line and the first initial signal line, which orthographic projections on the base substrate are overlapped, are connected with each other via a via hole.

In an exemplary embodiment of the present disclosure, the display panel further includes a pixel driving circuit and a light emitting unit, the pixel driving circuit is configured to drive the light emitting unit to emit light, and the pixel driving circuit includes: a driving transistor; a first transistor, having a first electrode connected to a first initial signal line and a second electrode connected to a gate electrode of the driving transistor; a second transistor, having a first electrode connected to the gate electrode of the driving transistor and a second electrode connected to a second electrode of the driving transistor; a fourth transistor, having a first electrode connected to the data line, and a second electrode connected to a first electrode of the driving transistor; a fifth transistor, having a first electrode connected to the power line, and a second electrode connected to the first electrode of the driving transistor; a sixth transistor, having a first electrode connected to the second electrode of the driving transistor, and a second electrode connected to the electrode part, the electrode part being configured to form a first electrode of the light emitting unit; a seventh transistor, having a first electrode connected to a second initial signal line, and a second electrode connected to the electrode part; and a capacitor, having a first electrode connected to the gate electrode of the driving transistor and a second electrode connected to the power line.

In an exemplary embodiment of the present disclosure, the display panel further includes: a first active layer, provided between the base substrate and the first source-drain layer, and including a third active part, a fourth active part, a fifth active part, a sixth active part, and a seventh active part, wherein the third active part is configured to form a channel region of the driving transistor, the fourth active part is configured to form a channel region of the fourth transistor, the fifth active part is configured to form a channel region of the fifth transistor, the sixth active part is configured to form a channel region of the sixth transistor, and the seventh active part is configured to form a channel region of the seventh transistor; a first gate layer, provided between the first active layer and the first source-drain layer, and including a second reset signal line, a second gate line, an enable signal line, a first conductive part, orthographic projections of the second reset signal line, the second gate line, and the enable signal line on the base substrate extending in a first direction, wherein the first conductive part is configured to form the gate electrode of the driving transistor and the first electrode of the capacitor, a portion of the second gate line is configured to form a gate electrode of the fourth transistor, a portion of the second reset signal line is configured to form a gate electrode of the seventh transistor, and a portion of the enable signal line is configured to form gate electrodes of the fifth transistor and the sixth transistor, respectively.

In an exemplary embodiment of the present disclosure, the display panel further includes: a second active layer, provided between the first gate layer and the first source-drain layer, and including a first active part and a second active part, the first active part being configured to form a channel region of the first transistor, and the second active part being configured to form a channel region of the second transistor; and a third gate layer, provided between the second active layer and the first source-drain layer, and including the first gate line and a first reset signal line, orthographic projections of the first gate line and the first reset signal line on the base substrate extending in the first direction, a portion of the first gate line is configured to form a top gate of the second transistor, and a portion of the first reset signal line is configured to form a top gate of the first transistor.

In an exemplary embodiment of the present disclosure, the third gate layer further includes the second initial signal line, and the second gate layer further includes the first initial signal line, orthographic projections of the first initial signal line and the second initial signal line on the base substrate extends in the first direction, in a same pixel driving circuit, the orthographic projections of the first initial signal line, the first reset signal line, the second gate line, the first gate line, the first conductive part, the enable signal line, the second initial signal line, and the second reset signal line on the base substrate are sequentially arranged in a second direction intersecting the first direction, the second gate line in a current row of the pixel driving circuits is reused as the second reset signal line in a previous row of the pixel driving circuits, and orthographic projections, on the base substrate, of the first initial signal line and the first reset signal line in an adjacent next row of the pixel driving circuits are located between the orthographic projections, on the base substrate, of the second initial signal line and the second reset signal line in the current row of the pixel driving circuits.

In an exemplary embodiment of the present disclosure, the first transistor and the second transistor are N-type transistors, and the driving transistor, the fourth transistor, the fifth transistor, the sixth transistor, and the seventh transistor are P-type transistors.

In an exemplary embodiment of the present disclosure, the display panel further includes a pixel driving circuit and a light emitting unit, the pixel driving circuit is configured to drive the light emitting unit to emit light; the electrode part is configured to form a first electrode of the light emitting unit, and the plurality of electrode parts include a first electrode part, a second electrode part, and a third electrode part; among a plurality of electrode parts connected to pixel driving circuits in a same row, the second electrode part, the first electrode part, the third electrode part, and the first electrode part are sequentially alternately arranged in a row direction; and in pixel driving circuits in two adjacent columns, a plurality of second electrode parts and a plurality of third electrode parts are connected to pixel driving circuits in a same column, the second electrode part and the third electrode part connected to the pixel driving circuits in the same column are sequentially alternately arranged in the column direction, a plurality of first electrode parts are connected to pixel driving circuits in another column, the first electrode parts connected to the pixel driving circuits in the same column are spaced apart in the column direction.

An aspect of the present disclosure provides a display device including the display panel described above.

It should be understood that the above general description and the following detailed descriptions are exemplary and explanatory only and do not limit the present disclosure.

BRIEF DESCRIPTION OF THE DRAWINGS

The accompanying drawings herein are incorporated into and form a part of the specification, illustrate embodiments consistent with the present disclosure, and are used in conjunction with the specification to explain the principle of the present disclosure. Obviously, the accompanying drawings in the following description are only some of the embodiments of the present disclosure, and those skilled in the art may obtain other accompanying drawings from these drawings without creative work.

FIG. 17 is a structure layout of the blocking layer and the first active layer in

FIG. 7;

DETAILED DESCRIPTION

Figure 1:
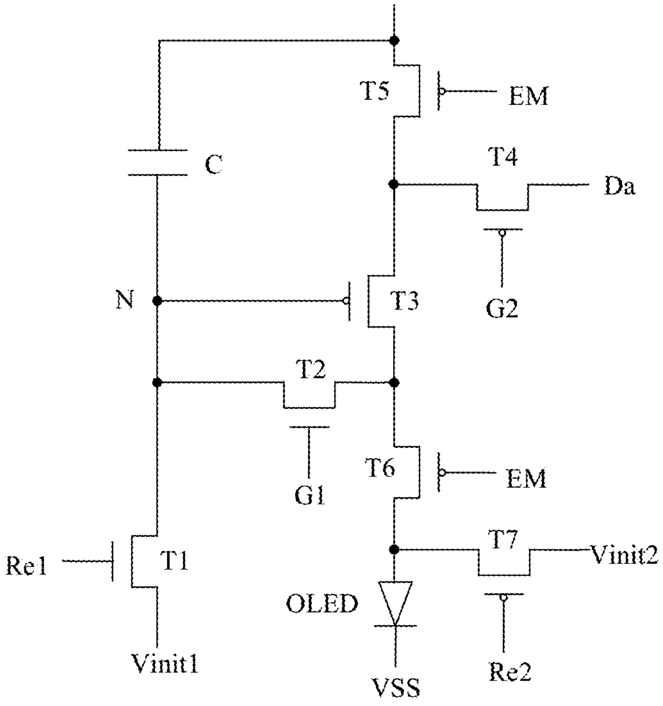
FIG. 1 is a schematic diagram of a circuit structure of a pixel driving circuit in the related art.

Example embodiments will now be described more fully with reference to the accompanying drawings. However, the example embodiments may be implemented in a variety of forms and should not be construed as being limited to the examples set forth herein; rather, these embodiments are provided so that the present disclosure may be more comprehensive and complete and the concept of the example embodiments may be conveyed to a person skilled in the art in a comprehensive manner. The same reference numerals in the drawings indicates the same or similar structure, and thus detailed descriptions thereof may be omitted.

The terms “a”, “an”, “said” are used to indicate the presence of one or more elements/components/etc.; and the terms “including” and “having” are used to indicate open-ended inclusion and mean that there may be additional elements/components/etc. in addition to those listed.

As shown in FIG. 1, a schematic diagram of a circuit structure of a pixel driving circuit in the related art is shown. The pixel driving circuit may include a driving transistor T3, a first transistor T1, a second transistor T2, a fourth transistor T4, a fifth transistor T5, a sixth transistor T6, a seventh transistor T7, and a capacitor C. A first electrode of the fourth transistor T4 is connected to a data signal terminal Da, a second electrode of the fourth transistor T4 is connected to a first electrode of the driving transistor T3, and a gate electrode of the fourth transistor T4 is connected to a second gate driving signal terminal G2. A first electrode of the fifth transistor T5 is connected to a first power supply terminal VDD, a second electrode of the fifth transistor T5 is connected to the first electrode of the driving transistor T3, and a gate electrode of the fifth transistor T5 is connected to an enable signal terminal EM. A gate electrode of the driving transistor T3 is connected to a node N. A first electrode of the second transistor T2 is connected to the node N, a second electrode of the second transistor T2 is connected to a second electrode of the driving transistor T3, and a gate electrode of the second transistor T2 is connected to the first gate driving signal terminal G1. A first electrode of the sixth transistor T6 is connected to the second electrode of the driving transistor T3, a second electrode of the sixth transistor T6 is connected to a second electrode of the seventh transistor T7, and a gate electrode of the sixth transistor T6 is connected to the enable signal terminal EM. A first electrode of the seventh transistor T7 is connected to a second initial signal terminal Vinit2, and a gate electrode of the seventh transistor T7 is connected to a second reset signal terminal Re2. A first electrode of the first transistor T1 is connected to the node N, a second electrode of the first transistor T1 is connected to a first initial signal terminal Vinit1, and a gate electrode of the first transistor T1 is connected to a first reset signal terminal Re1. A first electrode of the capacitor C is connected to the node N, and a second electrode of the capacitor C is connected to the first power supply terminal VDD. The pixel driving circuit may be connected to a light emitting unit OLED for driving the light emitting unit OLED to emit light, and the light emitting unit OLED may be connected between the second electrode of the sixth transistor T6 and a second power supply terminal VSS. The first transistor T1 and the second transistor T2 may be N-type transistors, for example, the first transistor T1 and the second transistor T2 may be N-type metal oxide transistors, the N-type transistor has a relatively small leakage current, which thus may avoid the leakage of the Node N through the first transistor T1 and the second transistor T2 in the light emitting phase. Meanwhile, the driving transistor T3, the fourth transistor T4, the fifth transistor T5, the sixth transistor T6, and the seventh transistor T7 may be P-type transistors, for example, the driving transistor T3, the fourth transistor T4, the fifth transistor T5, the sixth transistor T6, and the seventh transistor T7 may be P-type low temperature polycrystalline silicon transistors, and the P-type low temperature polycrystalline silicon transistor has a high carrier mobility, thereby facilitating the realization of a display panel with high resolution, high response speed, high pixel density, and high aperture rate. The first initial signal terminal and the second initial signal terminal may output the same or different voltage signals according to the actual situation.

Figure 2:
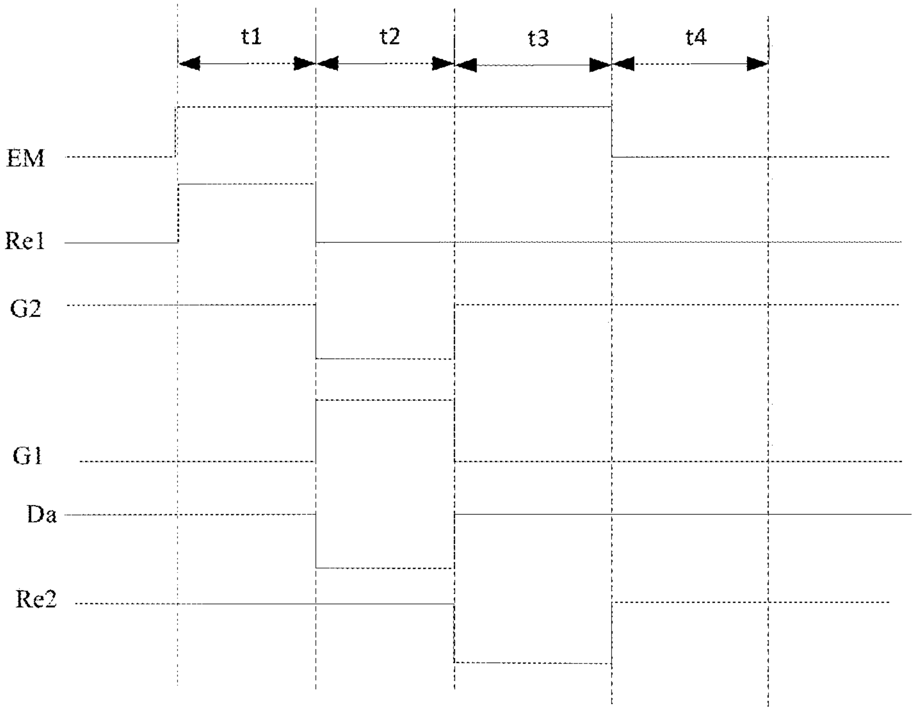
FIG. 2 is a timing diagram of each node in a driving method of the pixel driving circuit in FIG. 1.

As shown in FIG. 2, a timing diagram of each node in a driving method of the pixel driving circuit of FIG. 1 is shown. G1 denotes the timing of the first gate driving signal terminal G1, G2 denotes the timing of the second gate driving signal terminal G2, Re1 denotes the timing of the first reset signal terminal Re1, Re2 denotes the timing of the second reset signal terminal Re2, EM denotes the timing of the enable signal terminal EM, and Da denotes the timing of the data signal terminal Da. The driving method of the pixel driving circuit may include a first reset phase t1, a data writing phase t2, a second reset phase t3, and a light emitting phase t4. In the first reset phase t1, the first reset signal terminal Re1 outputs a high level signal, the first transistor T1 is turned on, and the first initial signal terminal Vinit1 inputs an initial signal to the node N. In the data writing phase t2, the first gate driving signal terminal G1 outputs a high level signal, the second gate driving signal terminal G2 outputs a low level signal, the fourth transistor T4 and the second transistor T2 are turned on, and at the same time, the data signal terminal Da outputs a data signal in order to write a voltage Vdata+Vth (i.e., the sum of the voltages Vdata and Vth) to the node N, where Vdata is a voltage of the data signal, and Vth is a threshold voltage of the driving transistor T3. In the second reset phase t3, the second reset signal terminal Re2 outputs a low level signal, the seventh transistor T7 is turned on, and the second initial signal terminal Vinit2 inputs an initial signal to the second electrode of the sixth transistor T6. In the light emitting phase t4, the enable signal terminal EM outputs a low level signal, the sixth transistor T6 and the fifth transistor T5 are turned on, and the driving transistor T3 emits light under the action of the voltage Vdata+Vth stored in the capacitor C.

The formula of the output current of the driving transistor is as follows:

$$I = (\mu WCox/2L)(Vgs - Vth)^2$$

where I is the output current of the driving transistor; μ is the carrier mobility; Cox is the gate capacitance per unit area, W is the channel width of the driving transistor, L is the channel length of the driving transistor, Vgs is the gate-source voltage difference of the driving transistor, and Vth is the threshold voltage of the driving transistor.

According to the above formula for the output current of the driving transistor, when bringing the gate voltage Vdata+Vth and the source voltage Vdd of the driving transistor in the pixel driving circuit of the present disclosure into the above formula, it may obtain the output current of the driving transistor in the pixel driving circuit of the present disclosure: $I=(\mu WCox/2L)\ (Vdata+Vth-Vdd-Vth)^2$. The pixel driving circuit may avoid the effect of the threshold voltage of the driving transistor on the output current thereof.

In the related art, the display panel may include a base substrate, a second source-drain layer, and an electrode layer stacked in that order. A data line in the display panel is generally provided in the second source-drain layer, and an electrode part of a light emitting unit in the display panel is generally provided in the electrode layer. When an orthographic projection of the data line on the base substrate and an orthographic projection of the electrode part on the base substrate are overlapped, the electrode part of the display panel may have a low flatness due to the data line. In particular, in the COE (Color On Encapsulation) technology, the poor flatness of the electrode part may directly cause optical characteristics such as color separation and color deviation of the display panel.

Figure 3:
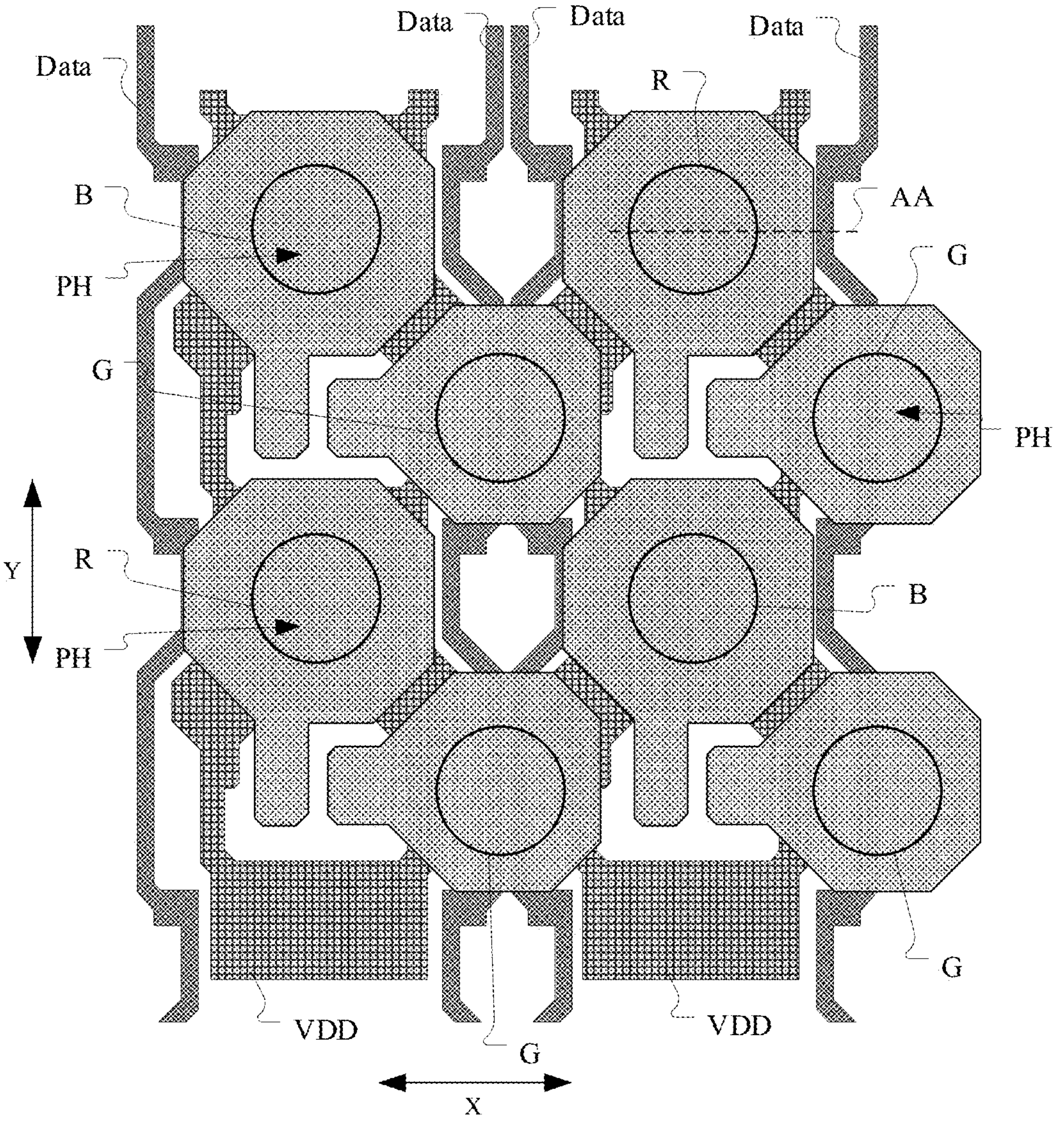
FIG. 3 is a structure layout of a display panel according to an exemplary embodiment of the present disclosure.
Figure 4:
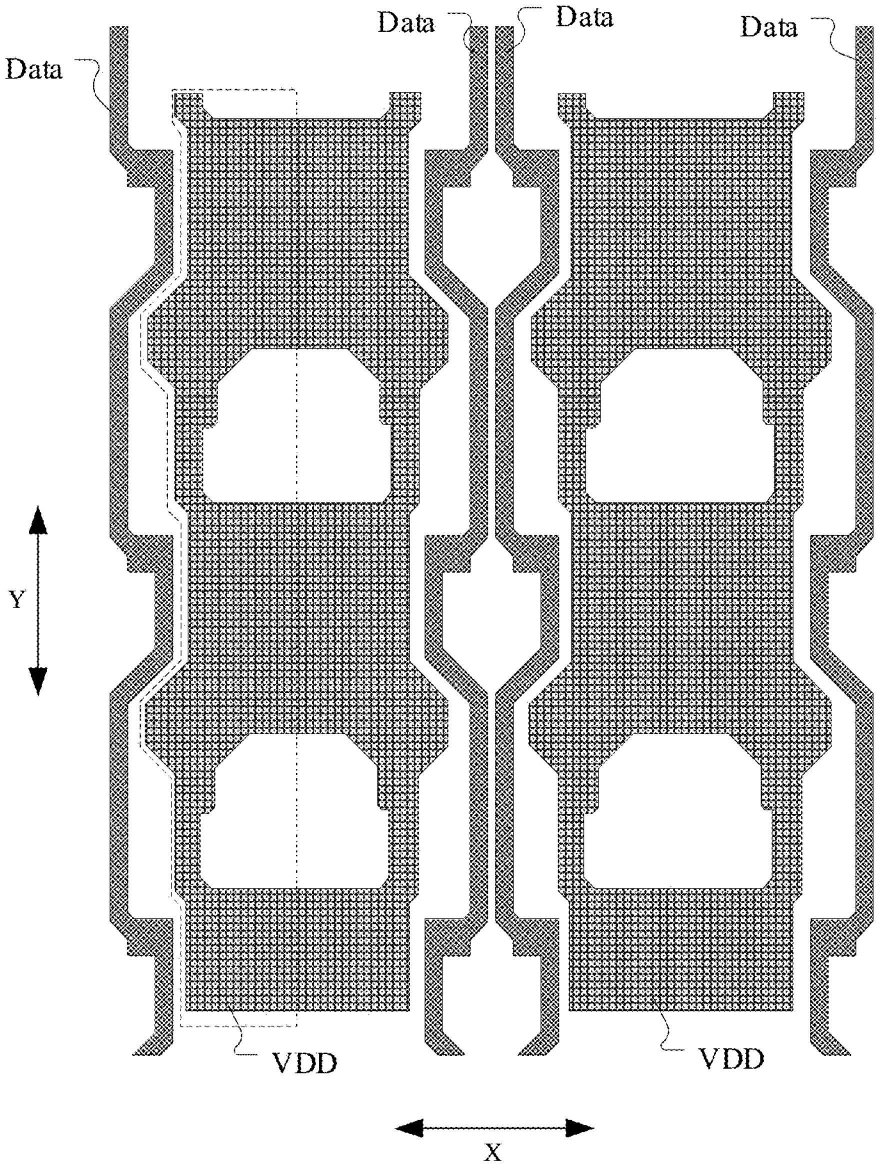
FIG. 4 is a structure layout of a first source-drain layer and a second source-drain layer in FIG. 3.

In view of the above, an exemplary embodiment provides a display panel, which may include a base substrate, a first source-drain layer, a second source-drain layer, an electrode layer, and a pixel definition layer. As shown in FIGS. 3 and 4, FIG. 3 is a structure layout of a display panel according to an exemplary embodiment of the present disclosure, and FIG. 4 is a structure layout of a first source-drain layer and a second source-drain layer in FIG. 3. The first source-drain layer is provided on a side of the base substrate, and the first source-drain layer includes a data line Data. The second source-drain layer is provided on a side of the first source-drain layer away from the base substrate, and the second source-drain layer includes a power line VDD. The electrode layer is provided on a side of the second source-drain layer away from the base substrate, and the electrode layer includes a plurality of electrode parts, which include a first electrode part G, a second electrode part B, and a third electrode part R. The pixel definition layer is provided on a side of the electrode layer away from the base substrate, the pixel definition layer has a plurality of pixel openings PH formed therein, the pixel opening PH is provided in correspondence with the electrode part, and an orthographic projection of the pixel opening PH on the base substrate coincides with an orthographic projection of the electrode part on the substrate coincide. An orthographic projection of the first electrode part G on the base substrate is at least partially overlapped with an orthographic projection of the data line Data on the base substrate.

In the exemplary embodiment, the data line which is overlapped with the first electrode part G is provided in the first source-drain layer far from the electrode layer, so that the flatness of the first electrode part G may be improved.

In an exemplary embodiment, the first electrode part G may be used to form an electrode part of a green light emitting unit in the display panel, the second electrode part B may be used to form an electrode part of a blue light emitting unit in the display panel, and the third electrode part R may be used to form an electrode part of a red light emitting unit.

As shown in FIGS. 3 and 4, an orthographic projection of the second electrode part B on the base substrate and an orthographic projection of the third electrode part R on the base substrate may fall on an orthographic projection of the power line VDD on the base substrate, which arrangement may enable the second electrode part B and the third electrode part R to have a better flatness.

In an exemplary embodiment, as shown in FIGS. 3 and 4, among a plurality of electrode parts connected to the pixel driving circuits in the same row, the second electrode part B, the first electrode part G, the third electrode part R, and the first electrode part G are sequentially alternately provided in a row direction X. In the pixel driving circuits in two adjacent columns, a plurality of second electrode parts B and a plurality of third electrode parts R are connected to the pixel driving circuits in the same column, the second electrode part B and the third electrode part R connected to the pixel driving circuits in the same column are sequentially alternately arranged in the column direction Y, the plurality of first electrode parts G are connected to the pixel driving circuits in another column, and the first electrode parts G connected to the pixel driving circuits in the same column are spaced apart in the column direction.

It is to be understood that in other exemplary embodiments, the electrode parts may be of other types and have other arrangement manners, for example, some of the electrode parts may also be used to form an electrode part of the white light emitting unit, and the electrode parts may also be arranged in a Real RGB manner. As long as there is an electrode part in the electrode layer which has an orthographic projection on the base substrate overlapped with an orthographic projection of the data line on the base substrate, the flatness of the electrode part may be improved by providing the data line in the first source-drain layer.

Figure 5:
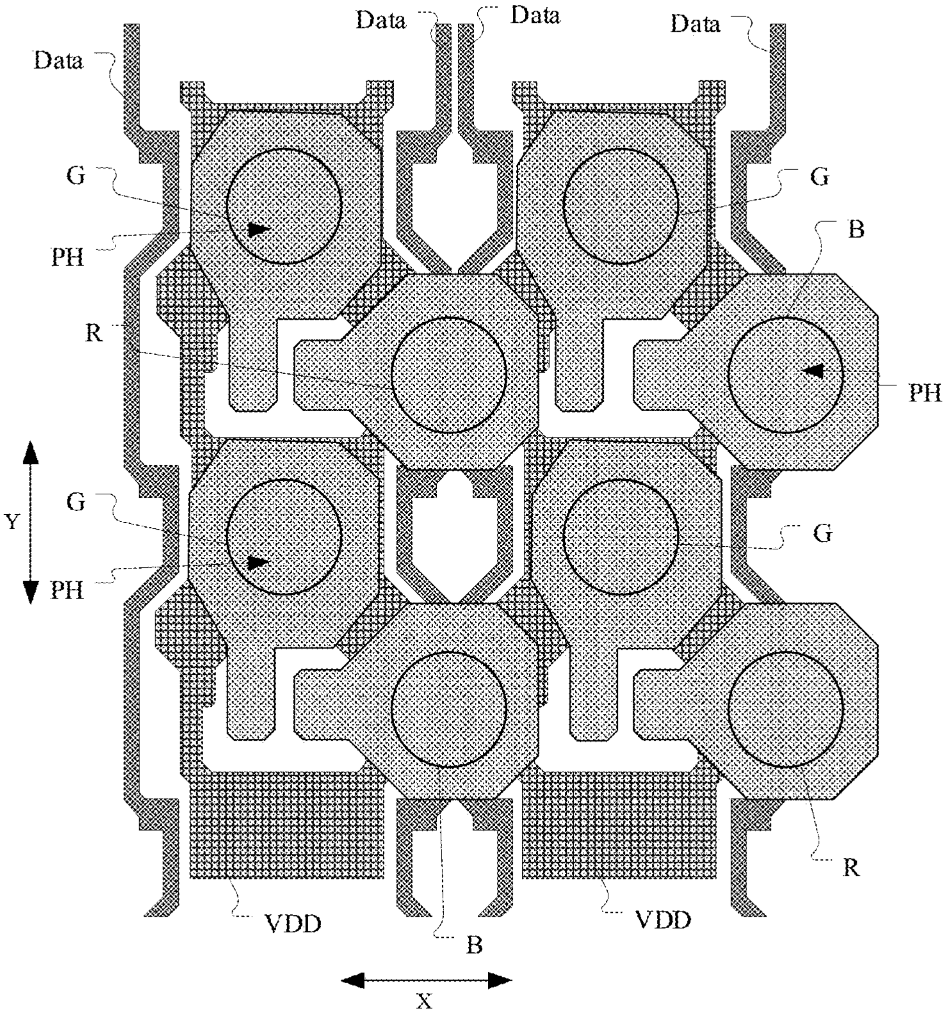
FIG. 5 is a structure layout of a display panel according to another exemplary embodiment of the present disclosure.

As shown in FIG. 5, a structure layout of a display panel according to another exemplary embodiment of the present disclosure is shown. Unlike the display panel shown in FIG. 3, in the display panel shown in FIG. 5, the orthographic projection of the first electrode part G on the base substrate falls on the orthographic projection of the power line VDD on the base substrate, and the orthographic projections of the second electrode part B and the third electrode part R on the base substrate are least partially overlapped with the orthographic projection of the data line Data on the base substrate. This arrangement reduces the parasitic capacitance between the second and third electrode parts B and R and other conductive structures. Based on the light emitting characteristics of the light emitting units of various colors, the voltages of the data signals required for the blue light emitting unit and the red light emitting unit at zero gray scale are lower than the voltage of the data signal required for the green light emitting unit at zero gray scale. In the exemplary embodiment, the lighting speeds of the red light emitting unit and the blue light emitting unit may be increased by reducing the parasitic capacitance of the electrode parts of the red light emitting unit and the blue light emitting unit, and thus the voltages of the data signals required for the blue light emitting unit and the red light emitting unit at the zero gray scale are increased, i.e., this arrangement may increase the potential range of the data signal (Datarange) required by the blue light emitting unit and the red light emitting unit throughout the entire range of gray scales, thus improving the voltage control accuracy of the data signal of the light emitting unit at low gray scale.

Figure 6:
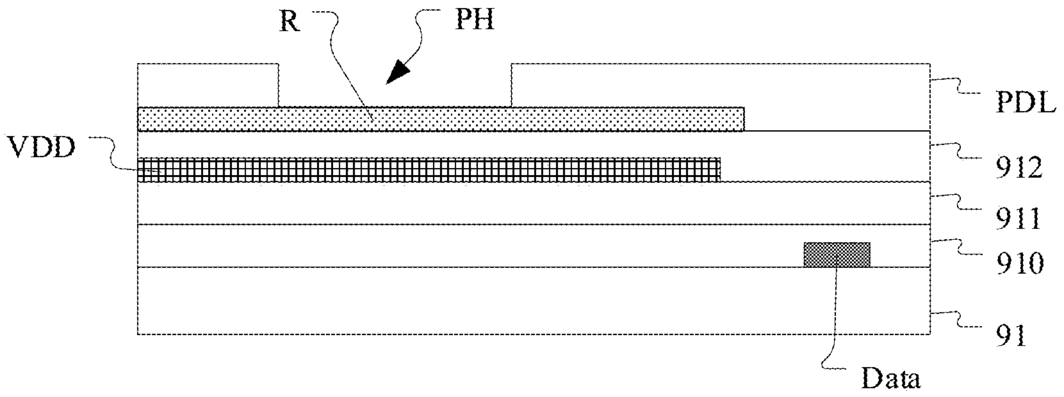
FIG. 6 is a partial sectional view of the display panel shown in FIG. 3 taken along the dashed line AA.

As shown in FIG. 6, a partial cross-sectional view of the display panel shown in FIG. 3 along the dashed line AA is shown. The first source-drain layer is provided on a side of the base substrate 91, the display panel may further include a first planarization layer 911 provided between the first source-drain layer and the second source-drain layer, and a second planarization layer 912 provided between the second source-drain layer and the electrode layer, and the pixel definition layer PDL is provided on the side of the electrode layer away from the base substrate 91. The first planarization layer 911 and the second planarization layer 912 may improve the flatness of the electrode part. The base substrate 91 may include a glass substrate, a barrier layer, and a polyimide layer stacked in that order, and the barrier layer may be an inorganic material. The first planarization layer 911 may include a polyimide layer, the structure of the second planarization layer 912 may be the same as the structure of the first planarization layer 911, and the materials of the first source-drain layer and the second source-drain layer may include a metal material, for example, it may one of molybdenum, aluminium, copper, titanium and niobium or an alloy thereof, or a molybdenum/titanium alloy or lamination and the like, or it may be a titanium/aluminium/titanium lamination. The display panel may also include a passivation layer 910 provided between the first source-drain layer and the first planarization layer 911, and the passivation layer 910 may include a silicon oxide layer.

An exemplary embodiment also provides a display panel, which may include a base substrate, a blocking layer, a first active layer, a first gate layer, a second gate layer, a second active layer, a third gate layer, a first source-drain layer, a second source-drain layer, and an electrode layer stacked in that order, and an insulating layer may be provided between adjacent ones of the above layers.

Figure 9:
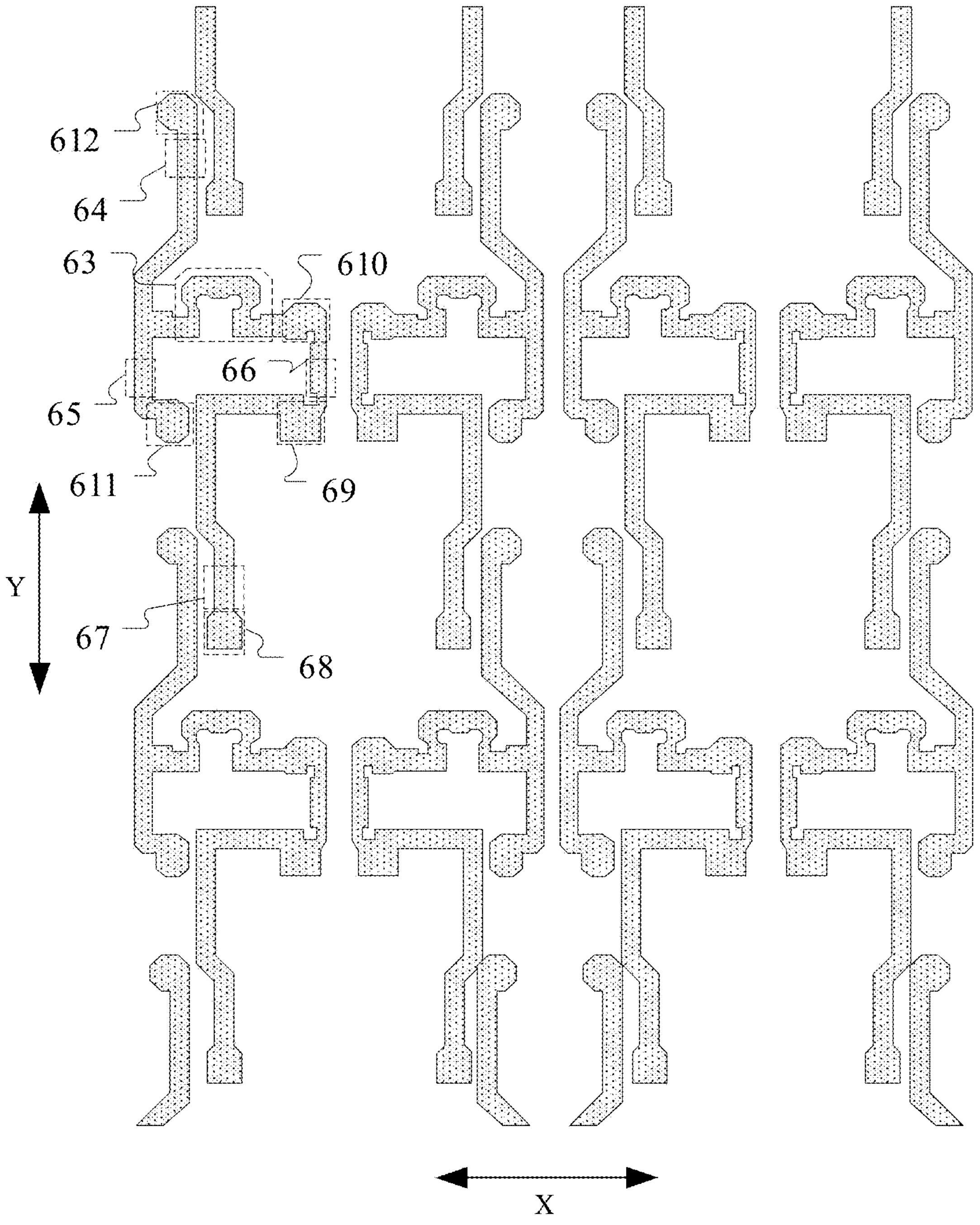
FIG. 9 is a structure layout of a first active layer in FIG. 7.
Figure 10:
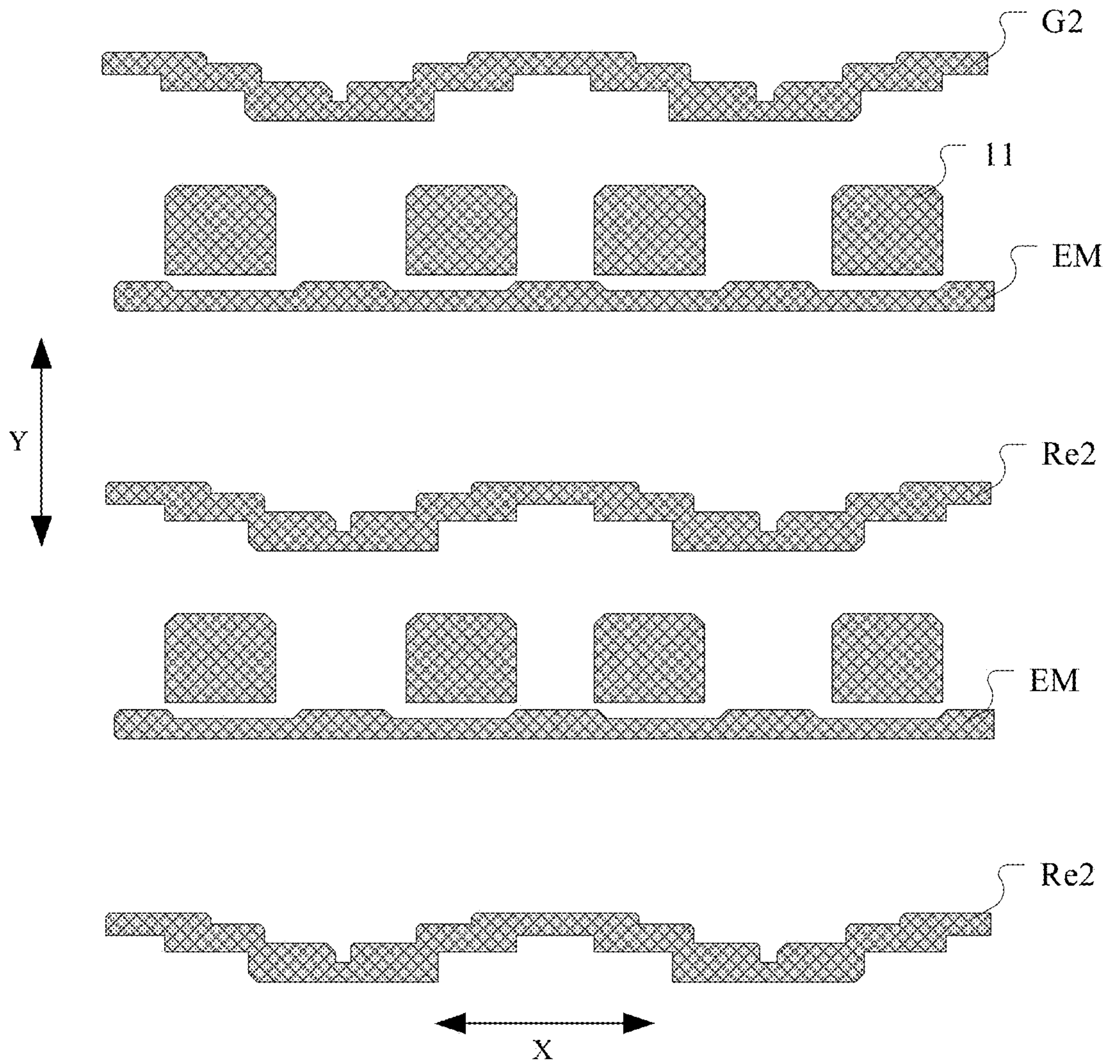
FIG. 10 is a structure layout of a first gate layer in FIG. 7.
Figure 11:
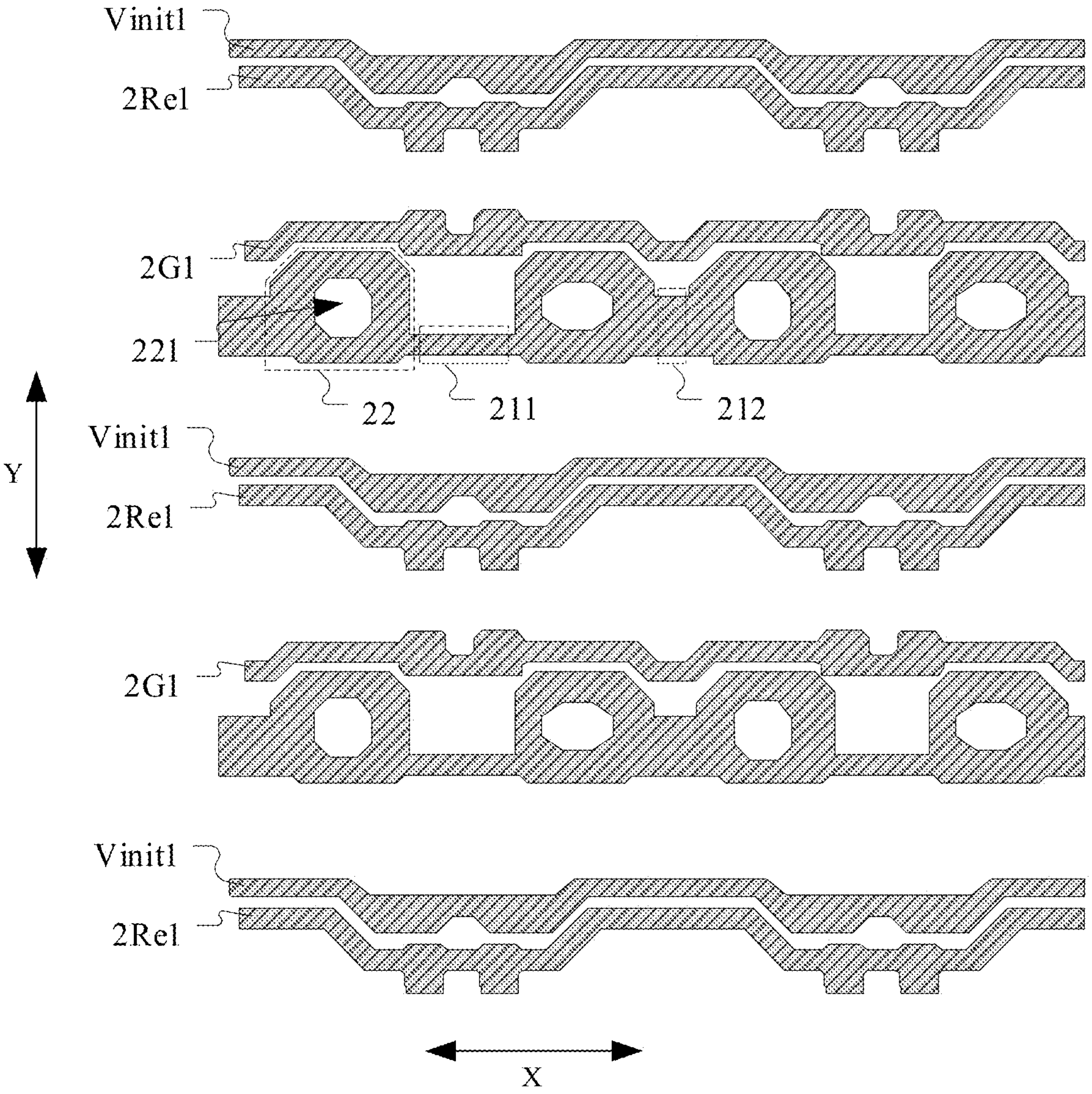
FIG. 11 is a structure layout of a second gate layer in FIG. 7.
Figure 12:
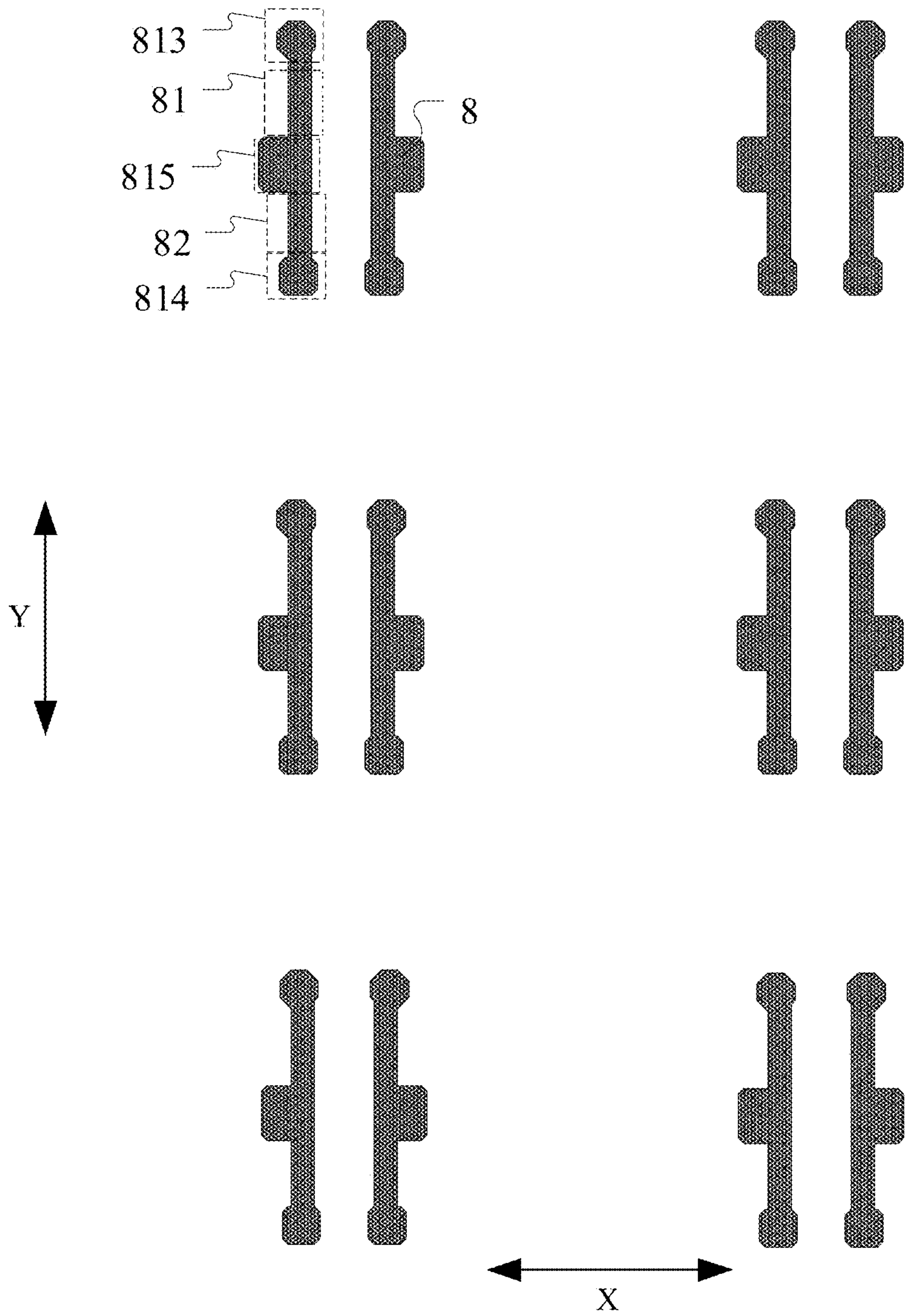
FIG. 12 is a structure layout of a second active layer in FIG. 7.
Figure 13:
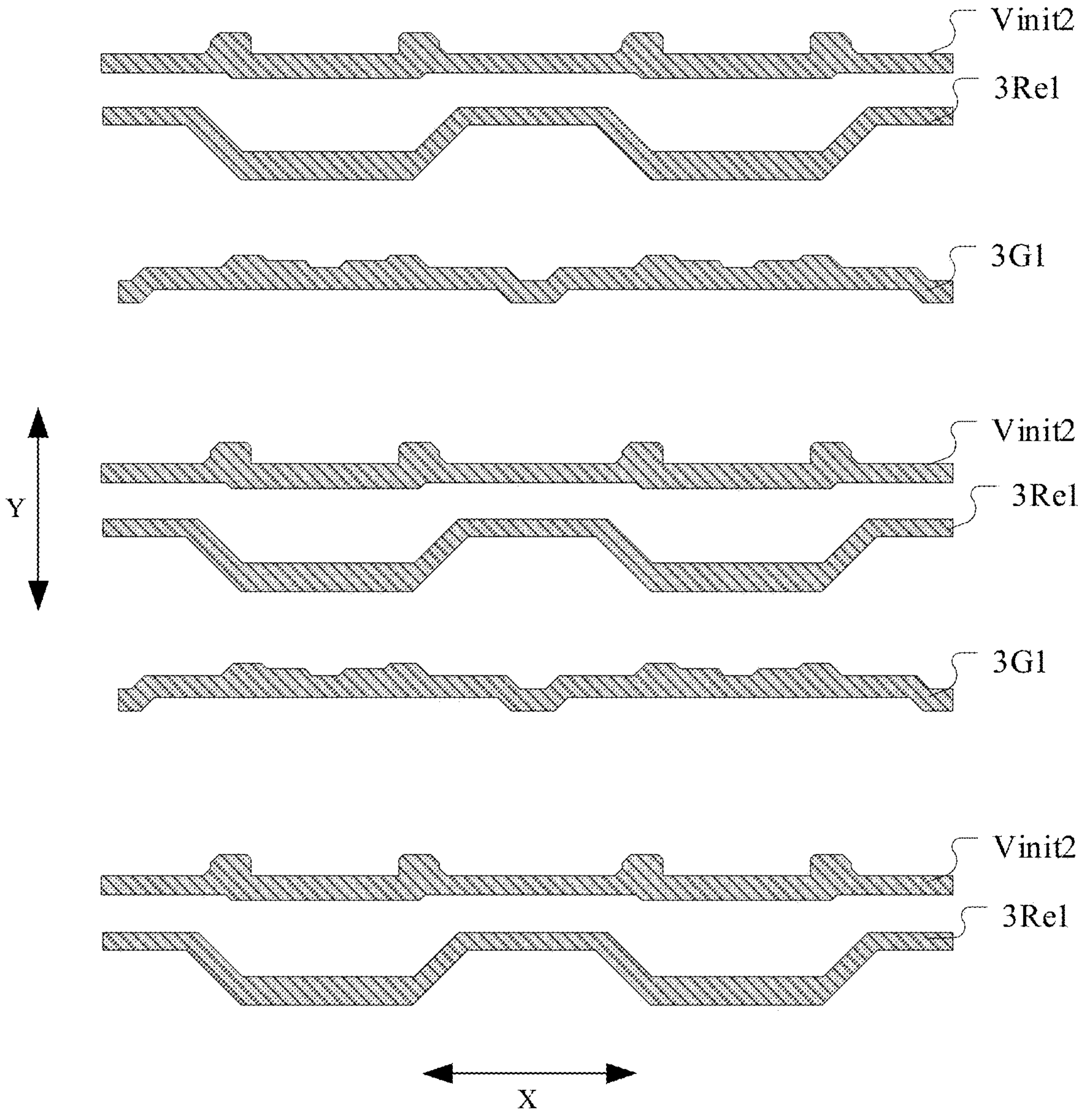
FIG. 13 is a structure layout of a third gate layer in FIG. 7.
Figure 14:
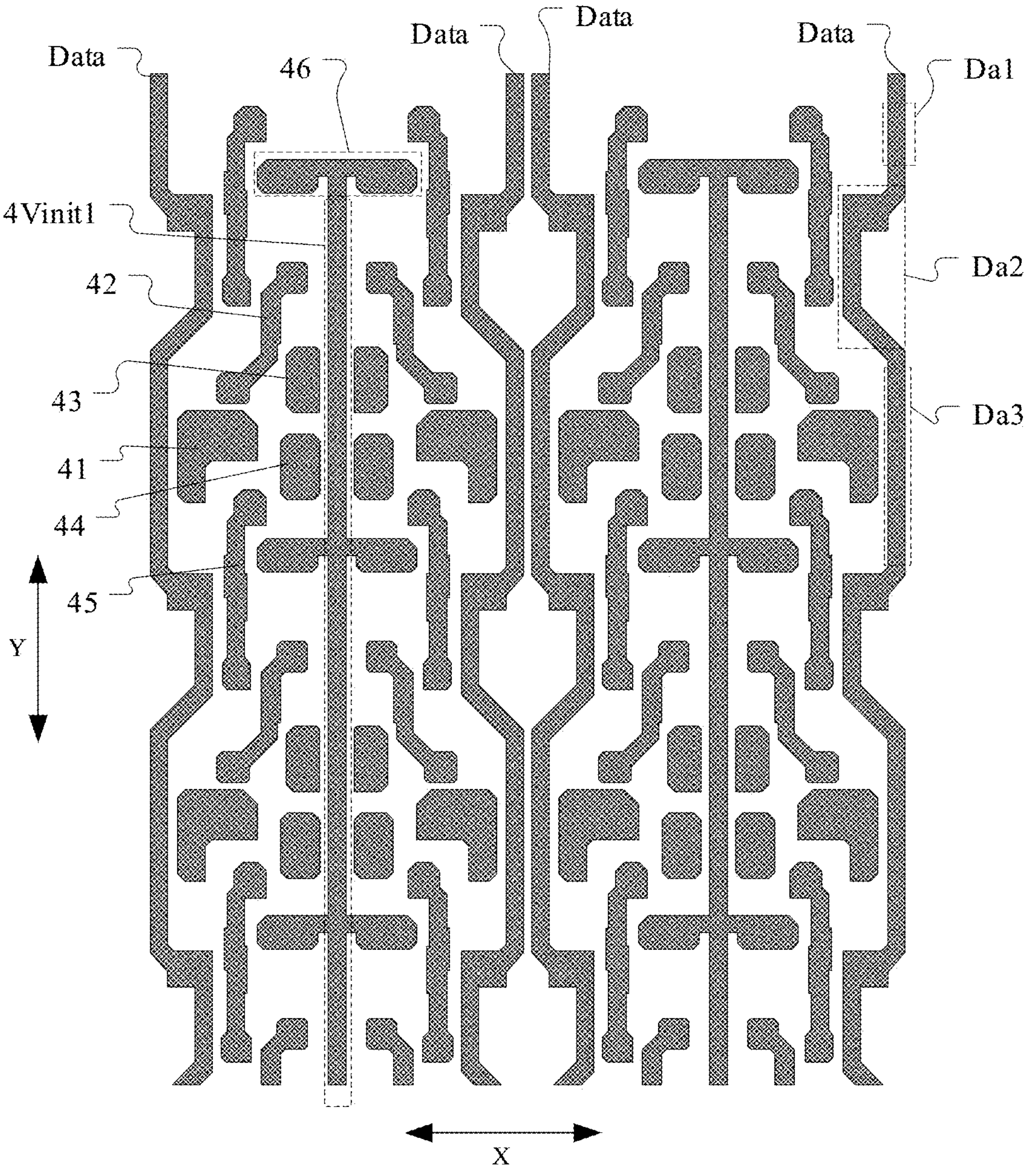
FIG. 14 is a structure layout of a first source-drain layer in FIG. 7.
Figure 15:
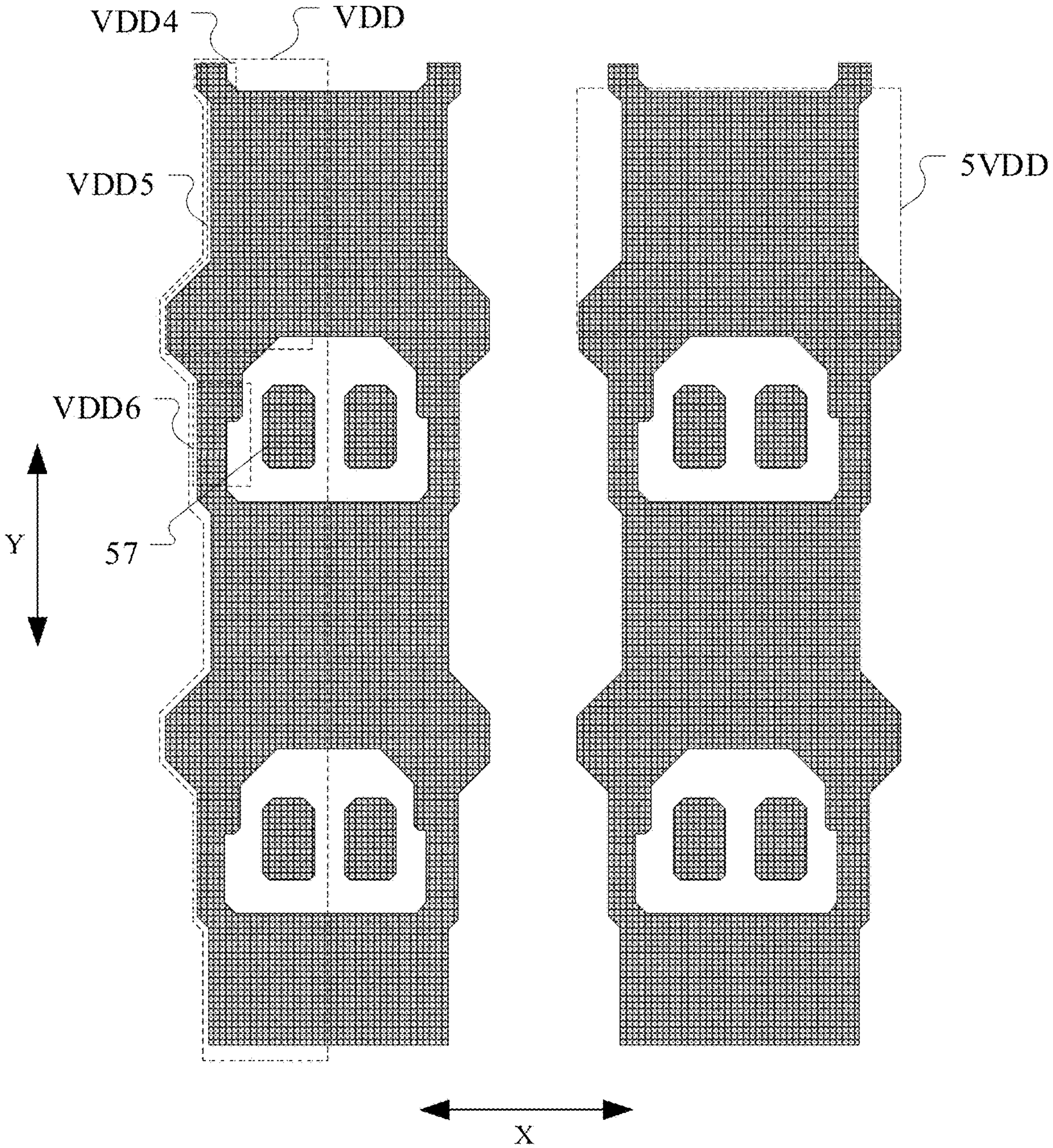
FIG. 15 is a structure layout of a second source-drain layer in FIG. 7.
Figure 16:
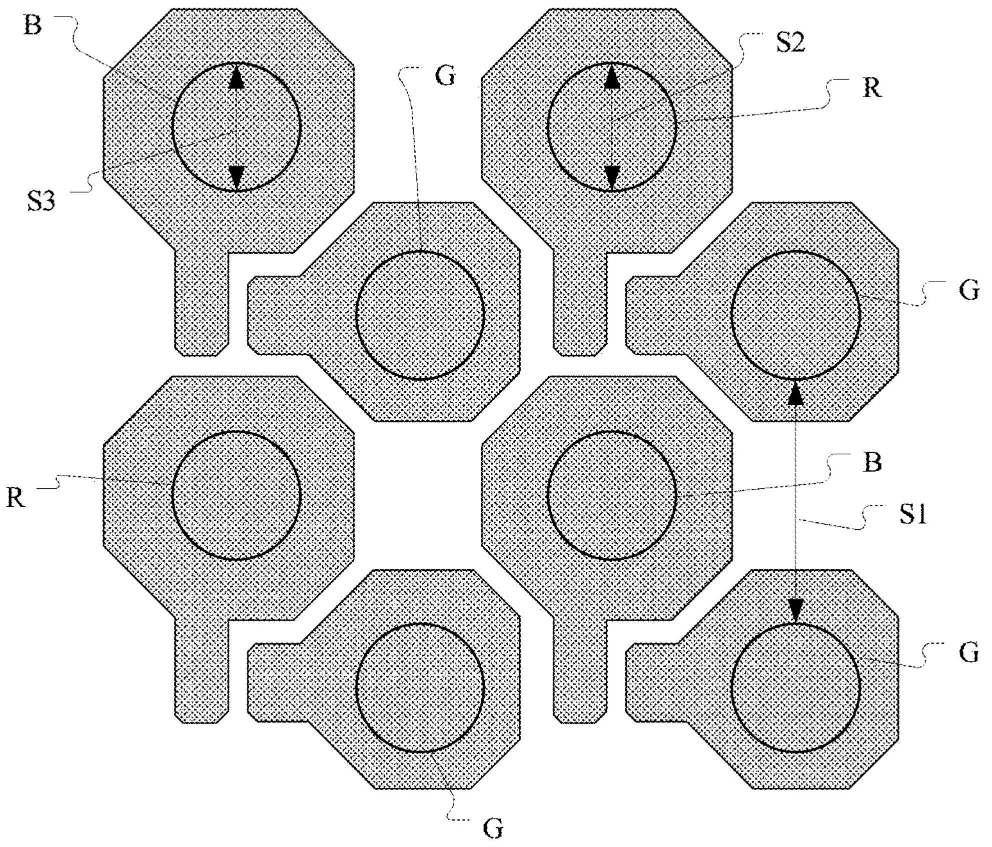
FIG. 16 is a structure layout of an electrode layer in FIG. 7.
Figure 17:
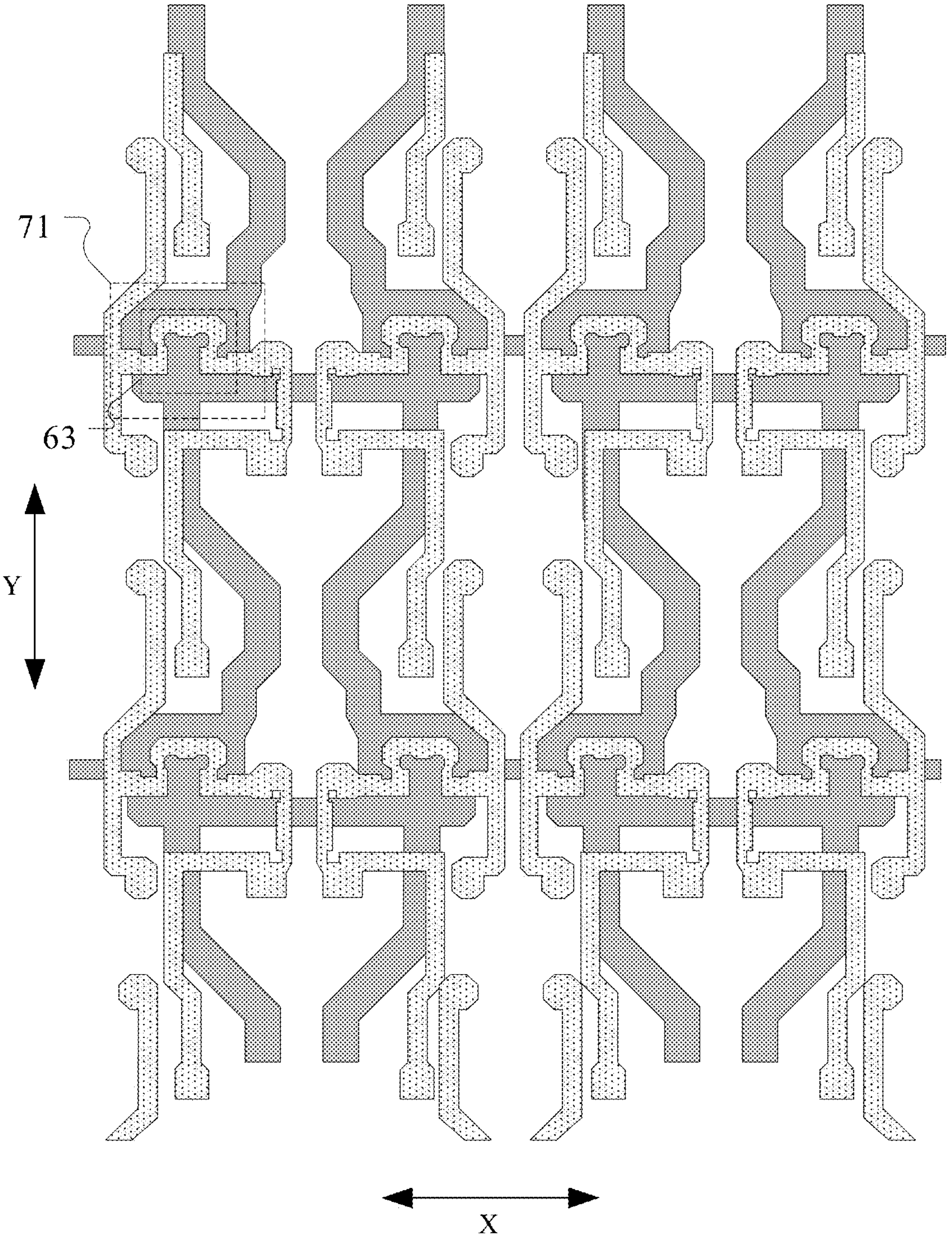
Figure 18:
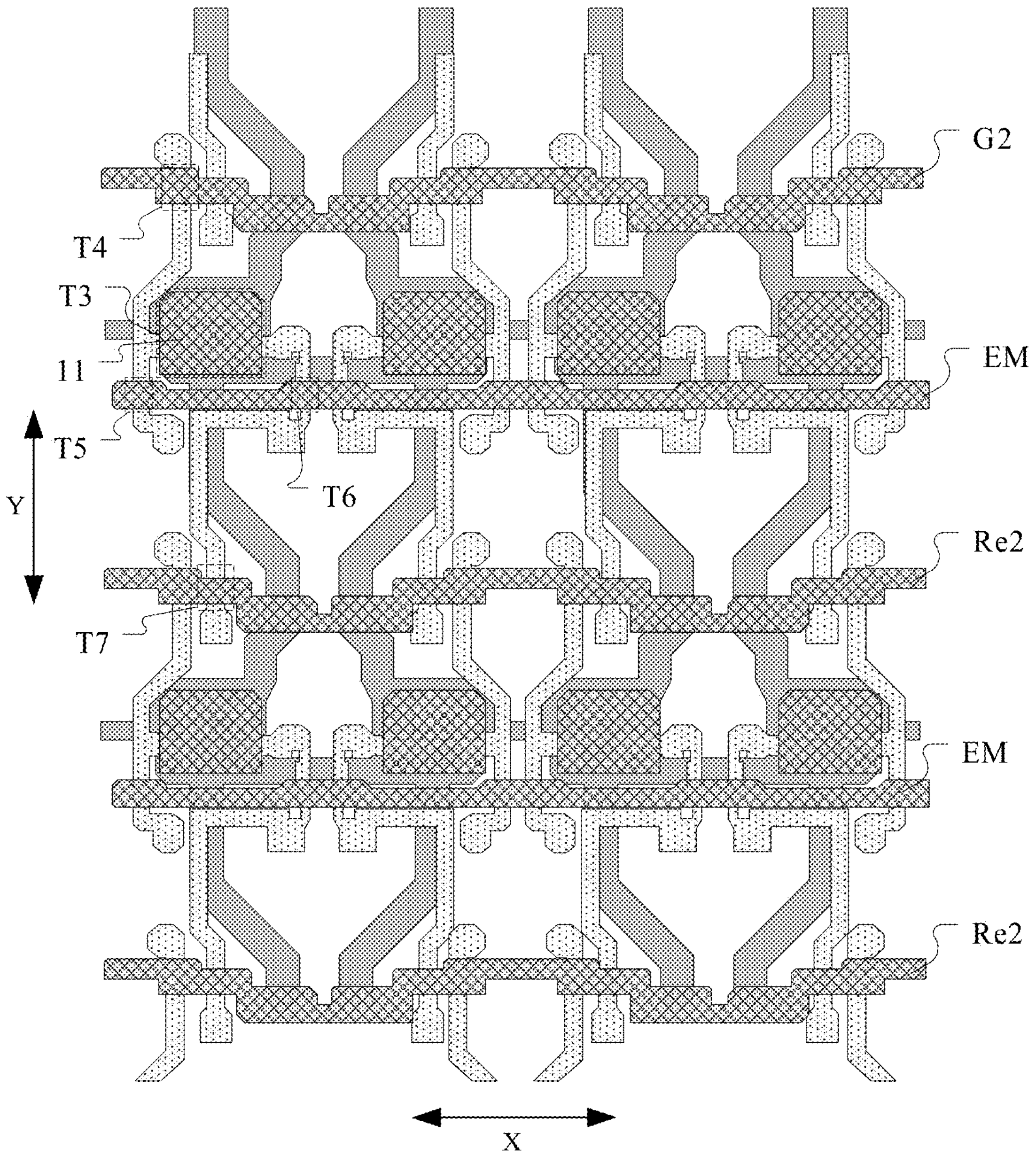
FIG. 18 is a structure layout of the blocking layer, the first active layer, and the first gate layer in FIG. 7.
Figure 19:
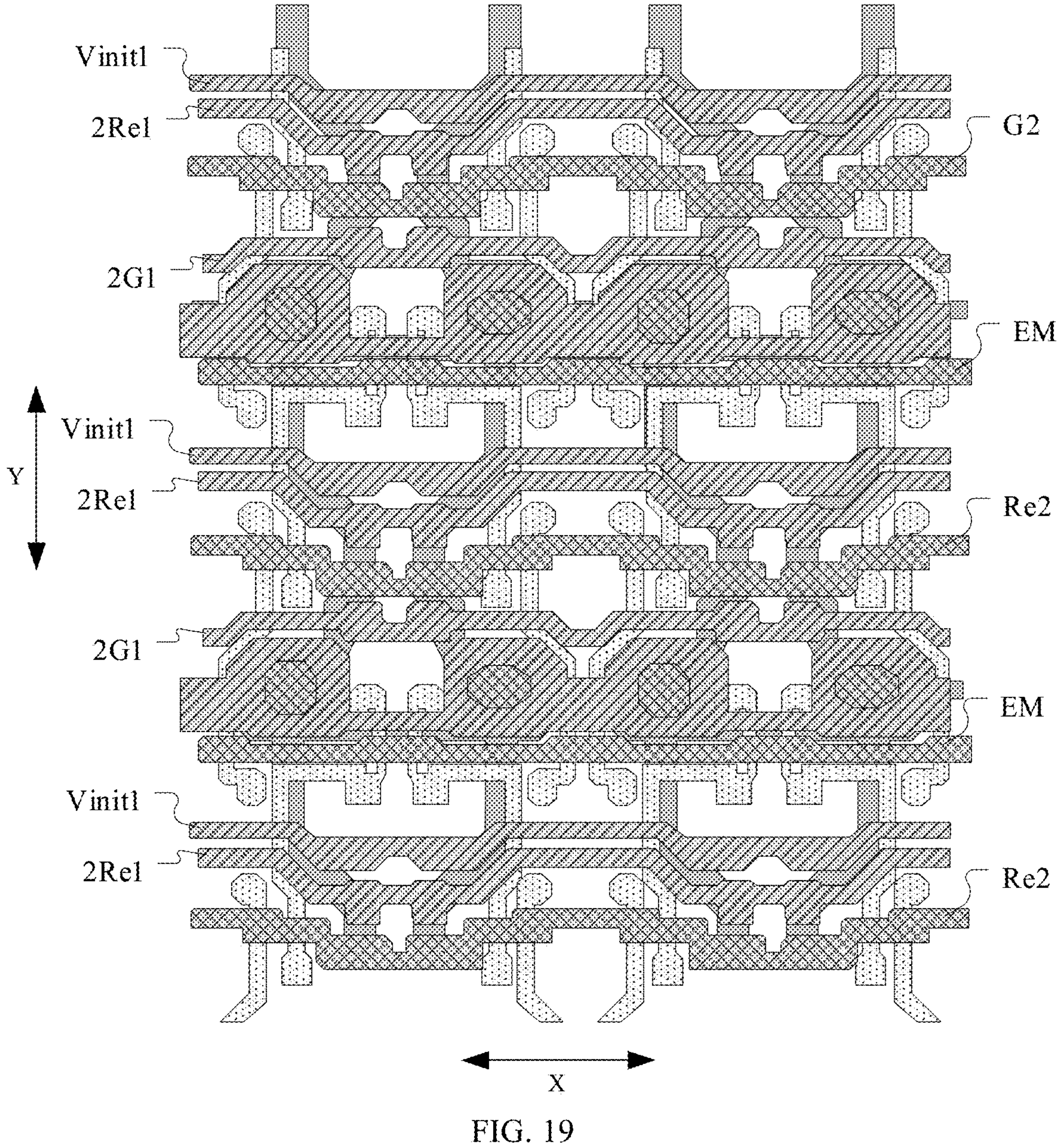
FIG. 19 is a structure layout of the blocking layer, the first active layer, the first gate layer, and the second gate layer in FIG. 7.
Figure 20:
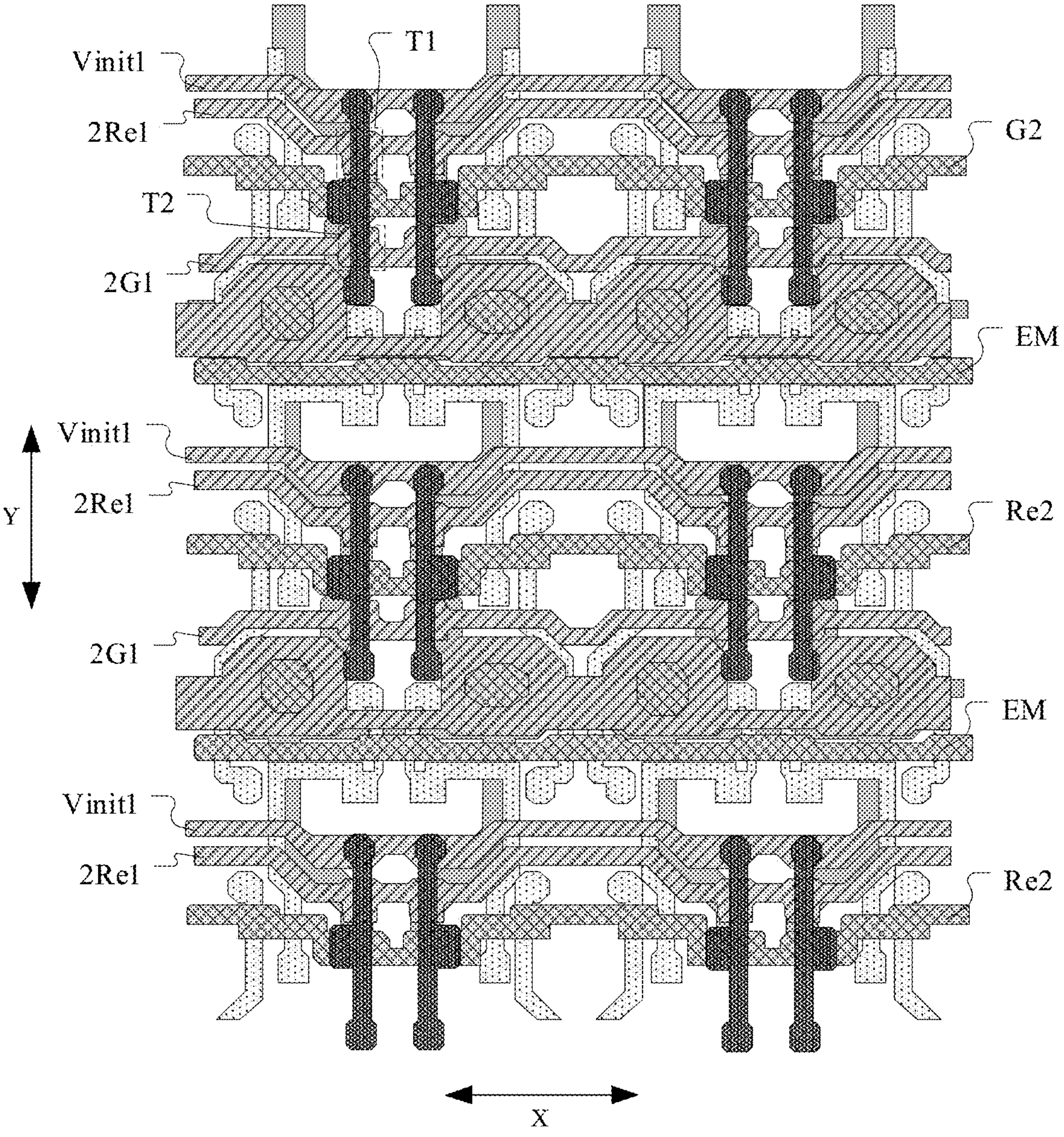
FIG. 20 is a structure layout of the blocking layer, the first active layer, the first gate layer, the second gate layer, and the second active layer in FIG. 7.
Figure 21:
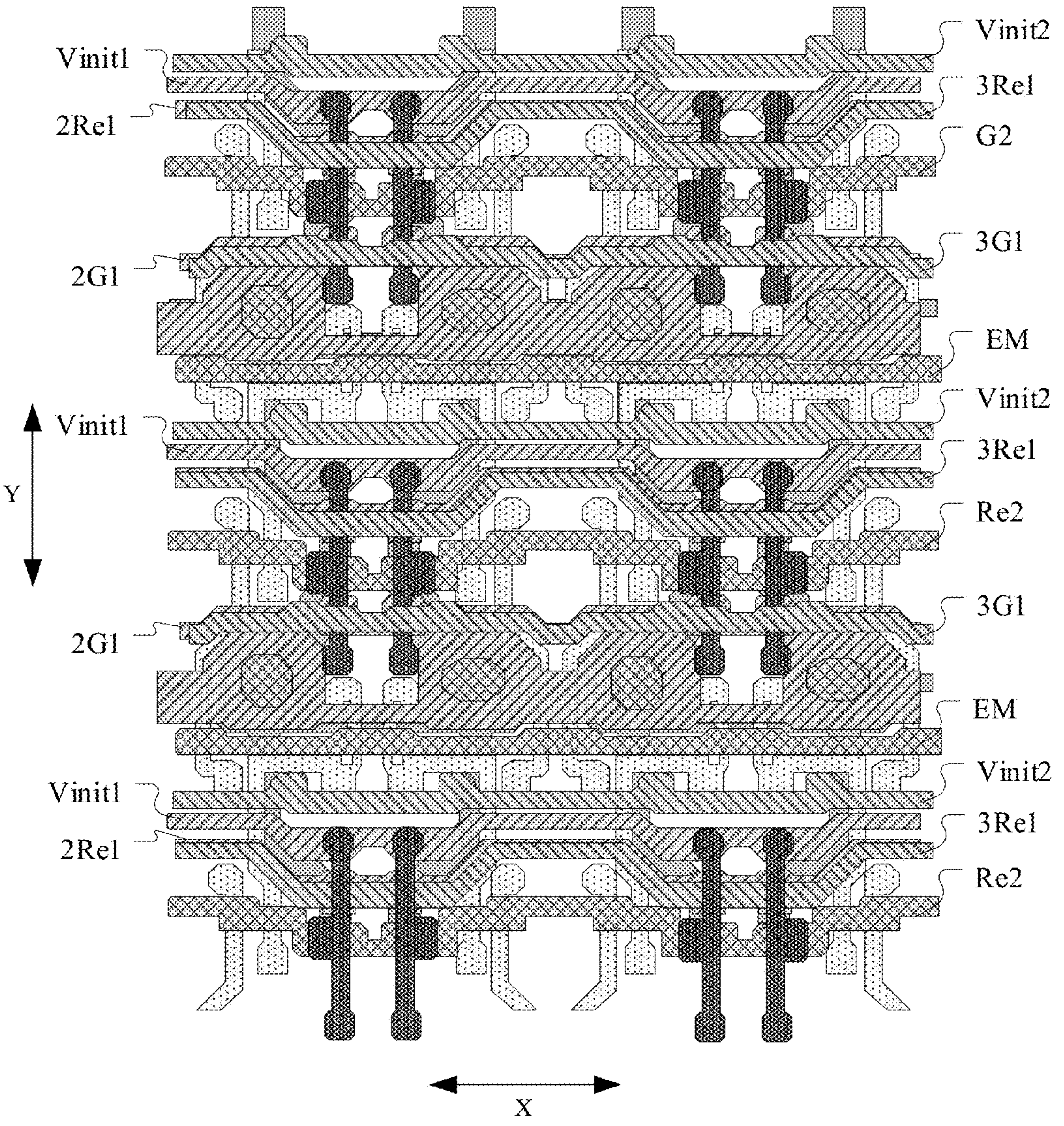
FIG. 21 is a structure layout of the blocking layer, the first active layer, the first gate layer, the second gate layer, the second active layer, and the third gate layer in FIG. 7.
Figure 22:
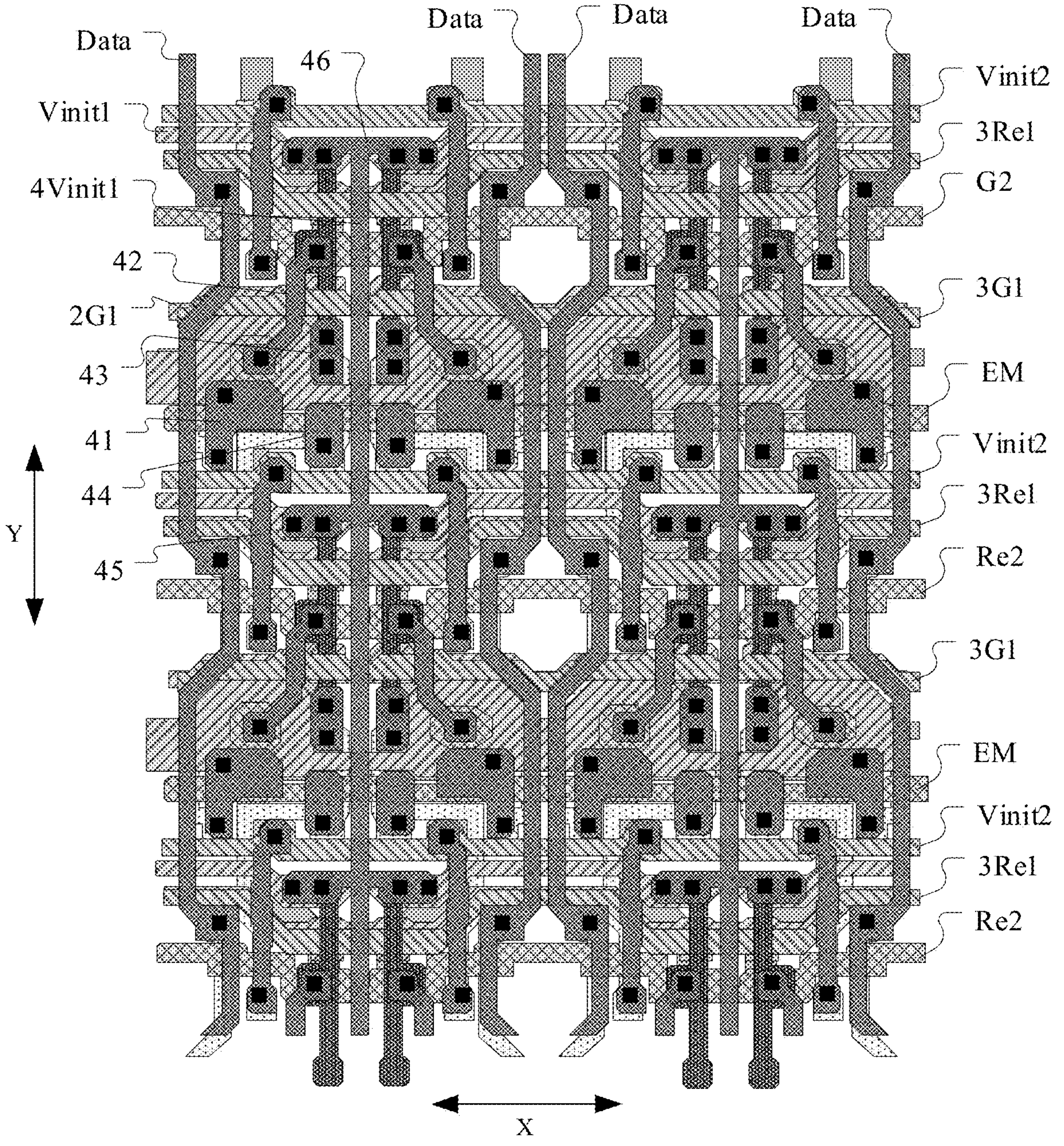
FIG. 22 is a structure layout of the blocking layer, the first active layer, the first gate layer, the second gate layer, the second active layer, the third gate layer, and the first source-drain layer in FIG. 7.
Figure 23:
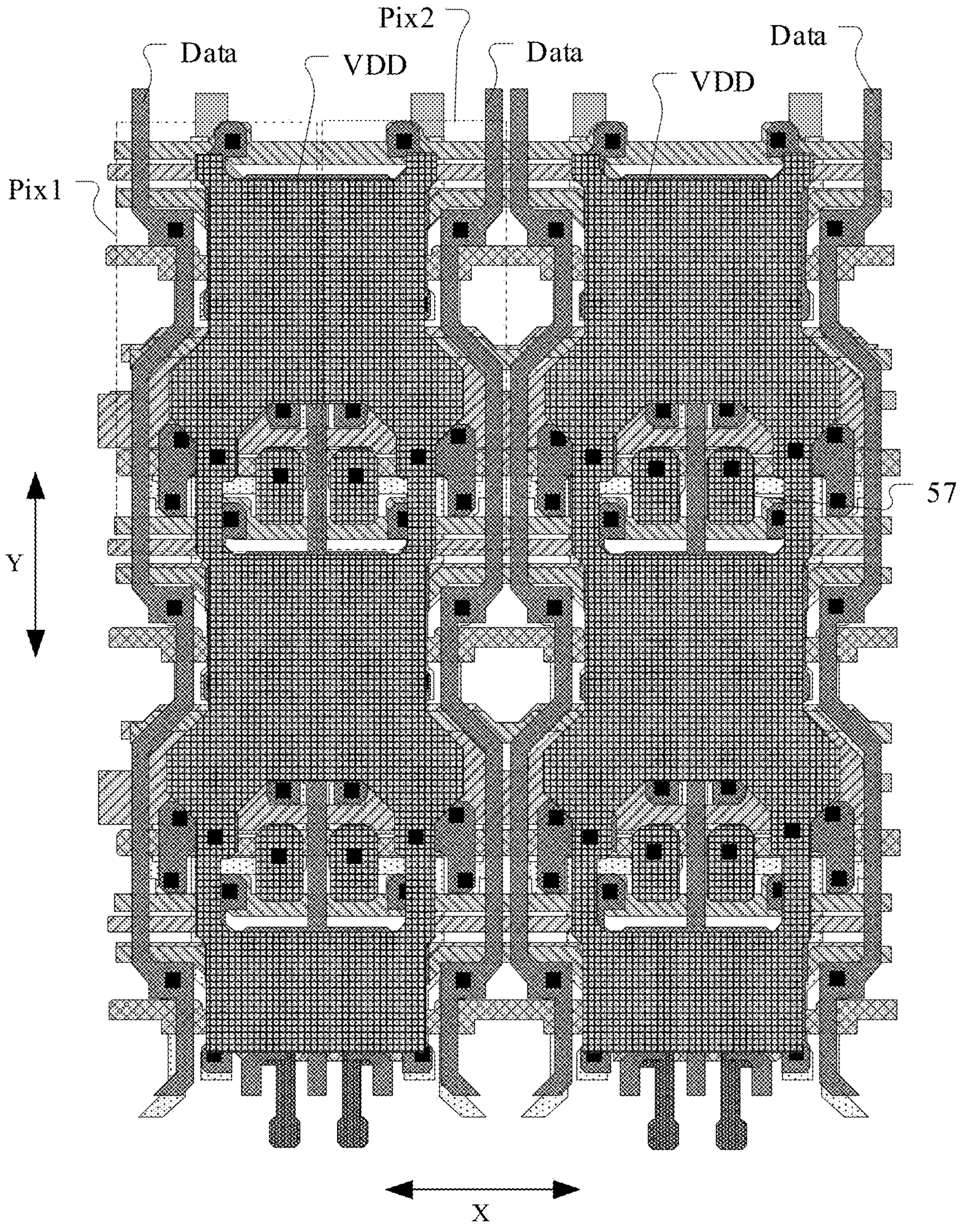
FIG. 23 is a structure layout of the blocking layer, the first active layer, the first gate layer, the second gate layer, the second active layer, the third gate layer, the first source-drain layer, and the second source-drain layer in FIG. 7.

As shown in FIGS. 7-23, FIG. 7 is a structure layout of a display panel according to an exemplary embodiment of the present disclosure; FIG. 8 is a structure layout of a blocking layer in FIG. 7; FIG. 9 is a structure layout of a first active layer in FIG. 7; FIG. 10 is a structure layout of a first gate layer in FIG. 7; FIG. 11 is a structure layout of a second gate layer in FIG. 7; FIG. 12 is a structure layout of a second active layer in FIG. 7; FIG. 13 is a structure layout of a third gate layer in FIG. 7; FIG. 14 is a structure layout of a first source-drain layer in FIG. 7; FIG. 15 is a structure layout of a second source-drain layer in FIG. 7; FIG. 16 is a structure layout of an electrode layer in FIG. 7; FIG. 17 is a structure layout of the blocking layer and the first active layer in FIG. 7; FIG. 18 is a structure layout of the blocking layer, the first active layer, and the first gate layer in FIG. 7; FIG. 19 is a structure layout of the blocking layer, the first active layer, the first gate layer, and the second gate layer in FIG. 7; FIG. 20 is a structure layout of the blocking layer, the first active layer, the first gate layer, the second gate layer, and the second active layer in FIG. 7; FIG. 21 is a structure layout of the blocking layer, the first active layer, the first gate layer, the second gate layer, the second active layer, and the third gate layer in FIG. 7; FIG. 22 is a structure layout of the blocking layer, the first active layer, the first gate layer, the second gate layer, the second active layer, the third gate layer, and the first source-drain layer in FIG. 7; FIG. 23 is a structure layout of the blocking layer, the first active layer, the first gate layer, the second gate layer, the second active layer, the third gate layer, the first source-drain layer, and the second source-drain layer in FIG. 7. The display panel may include a plurality of pixel driving circuits shown in FIG. 1. As shown in FIG. 23, the plurality of pixel driving circuits may include a first pixel driving circuit Pix1 and a second pixel driving circuit Pix2 arranged adjacent to each other in a first direction X. The first pixel driving circuit Pix1 and the second pixel driving circuit Pix2 may be provided in a mirror symmetrical manner. The first pixel driving circuit Pix1 and the second pixel driving circuit Pix2 may form one repetition unit, and the display panel may include a plurality of repetition units arranged in array in the first direction X and the second direction Y. The first direction X and the second direction Y may intersect with each other, for example, the first direction may be a row direction and the second direction may be a column direction.

Figure 7:
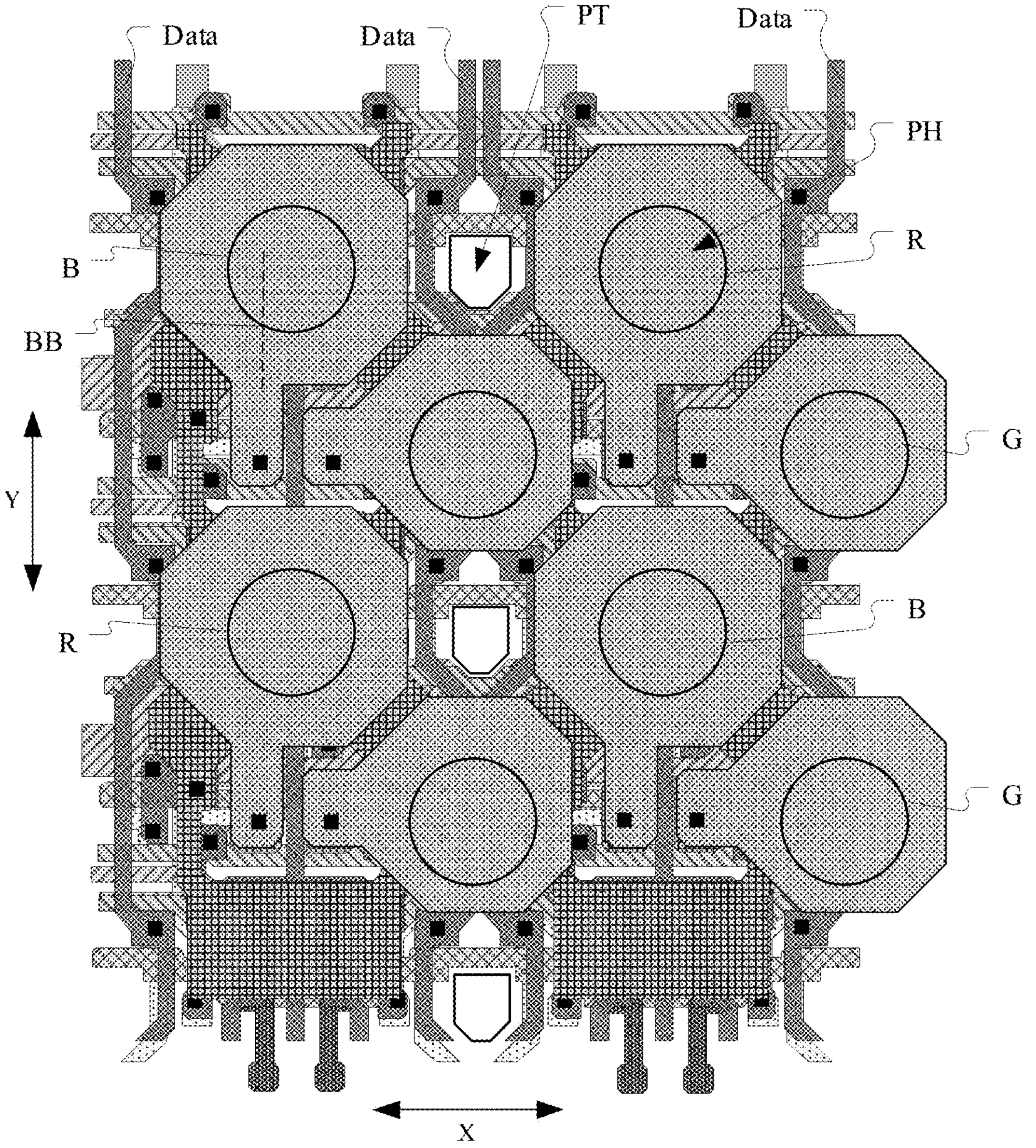
FIG. 7 is a structure layout of a display panel according to an exemplary embodiment of the present disclosure.
Figure 8:
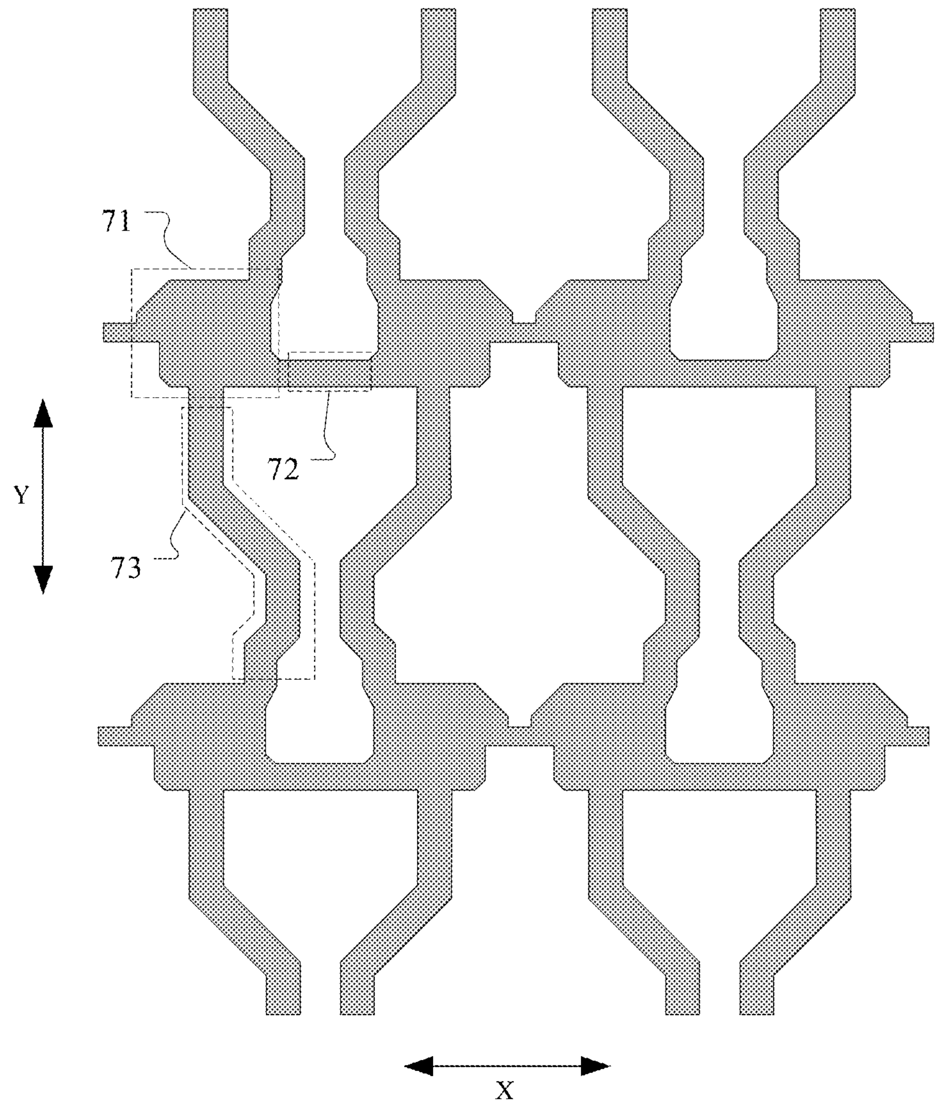
FIG. 8 is a structure layout of a blocking layer in FIG. 7.

As shown in FIGS. 7, 8, and 17, the blocking layer may include a plurality of blocking parts 71, connection parts 73, and connection parts 72. The connection part 73 has an orthographic projection on the base substrate extending in the second direction Y and is connected between adjacent blocking parts 71 in the second direction Y. The connection part 72 has an orthographic projection on the base substrate extending in the first direction X and is connected between adjacent blocking parts 71 in the first direction X.

As shown in FIGS. 7, 9, 17, 18, the first active layer may include a third active part 63, a fourth active part 64, a fifth active part 65, a sixth active part 66, a seventh active part 67, an eighth active part 68, a ninth active part 69, a tenth active part 610, an eleventh active part 611, and a twelfth active part 612. The third active part 63 may be used to form a channel region of the driving transistor T3; the fourth active part 64 may be used to form a channel region of the fourth transistor T4; the fifth active part 65 may be used to form a channel region of the fifth transistor T5; the sixth active part 66 may be used to form a channel region of the sixth transistor T6; the seventh active part 67 may be used to form a channel region of the seventh transistor T7; the eighth active part 68 is connected to an end of the seventh active part 67 away from the sixth active part 66; the ninth active part 69 is connected between the seventh active part 67 and the sixth active part 66; the tenth active part 610 is connected between the third active part 63 and the sixth active part 66; the eleventh active part 611 is connected to an end of the fifth active part 65 away from the third active part 63; and the twelfth active part 612 is connected to an end of the fourth active part 64 away from the third active part 63. As shown in FIG. 17, the orthographic projection of the blocking part 71 on the base substrate may cover the orthographic projection of the third active part 63 on the base substrate, and the blocking part 71 may reduce the effect of light on the characteristics of the driving transistor. The first active layer may be formed from a polysilicon material, and accordingly, the driving transistor T3, the fourth transistor T4, the fifth transistor T5, the sixth transistor T6, and the seventh transistor T7 may be P-type low-temperature polycrystalline silicon thin-film transistors.

As shown in FIGS. 7, 10, 18, the first gate layer may include a first conductive part 11, a second gate line G2, an enable signal line EM, and a second reset signal line Re2. The second gate line G2 may be used to provide the second gate driving signal terminal in FIG. 1; the enable signal line EM may be used to provide the enable signal terminal in FIG. 1; and the second reset signal line Re2 may be used to provide the second reset signal terminal in FIG. 1. The orthographic projection of the second gate line G2 on the base substrate, the orthographic projection of the enable signal line EM on the base substrate, and the orthographic projection of the second reset signal line Re2 on the base substrate may extend in the first direction X. The orthographic projection of the second gate line G2 on the base substrate covers the orthographic projection of the fourth active part 64 on the base substrate, and a portion of the second gate line G2 is used to form a gate electrode of the fourth transistor. The orthographic projection of the enable signal line EM on the base substrate covers the orthographic projection of the fifth active part 65 on the base substrate and the orthographic projection of the sixth active part 66 on the base substrate, and a portion of the enable signal line EM may be used to form the gate electrodes of the fifth transistor T5 and the sixth transistor T6, respectively. The orthographic projection of the second reset signal line Re2 on the base substrate may cover the orthographic projection of the seventh active part 67 on the base substrate, and a portion of the second reset signal line Re2 may be used to form the gate electrode of the seventh transistor T7. The orthographic projection of the first conductive part 11 on the base substrate covers the orthographic projection of the third active part 63 on the base substrate, and the first conductive part 11 may be used to form the gate electrode of the driving transistor T3 and the first electrode of the capacitor C. As shown in FIG. 18, the second gate line G2 in the pixel driving circuits in the current row may be reused as the second reset signal line Re2 in the pixel driving circuits in the previous row. This arrangement may improve the integration of the pixel driving circuits and reduce the layout area of the pixel driving circuits. The blocking layer may be connected to a stable power supply terminal, for example, the blocking layer may be connected to the first power supply terminal, the first initial signal terminal, the second initial signal terminal, and the like in FIG. 1. The blocking part 71 may act as a voltage stabilizer for the first conductive part 11, thereby reducing voltage fluctuations of the gate electrode of the driving transistor T3 in the light emitting phase. In addition, the display panel may make the first active layer conductive by using the first gate layer as a mask, i.e. a region of the first active layer covered by the first gate layer may form a channel region of the transistor, and a region thereof not covered by the first gate layer forms a conductive structure.

As shown in FIGS. 7, 11, 19, the second gate layer may include a first initial signal line Vinit1, a third reset signal line 2Re1, a third gate line 2G1, and a plurality of second conductive parts 22. The first initial signal line Vinit1 is used to provide the first initial signal terminal in FIG. 1, the third reset signal line 2Re1 may be used to provide the first reset signal terminal in FIG. 1, the third gate line 2G1 may be used to provide the first gate driving signal terminal in FIG. 1. The orthographic projection of the first initial signal line Vinit1 on the base substrate, the orthographic projection of the third reset signal line 2Re1 on the base substrate, and the orthographic projection of the third gate line 2G1 on the base substrate may all extend in the first direction X. The orthographic projection of the second conductive part 22 on the base substrate may be at least partially overlapped with the orthographic projection of the first conductive part 11 on the base substrate, and the second conductive part 22 may be used to form the second electrode of the capacitor C. As shown in FIG. 11, the second gate layer may further include a plurality of first connection parts 211 and a plurality of second connection parts 212, the first connection part 211 is connected between two second conductive parts 22 in the same repetition unit, and the second connection part 212 is connected between two second conductive parts 22 in adjacent repetition units. As shown in FIG. 19, between two adjacent pixel driving circuits in the same unit, the orthographic projection of the first connection part 211 on the base substrate may at least partially coincide with the orthographic projection of the connection part 72 on the base substrate, and the orthographic projection of the second connection part 212 on the base substrate may at least partially coincide with the orthographic projection of the connection part 72 on the base substrate. This arrangement reduce the shading effect of the first connection part 211 and the second connection part 212 on the display panel, and improve the transmittance rate of the display panel. Among other things, the size in the second direction Y of the orthographic projection of the first connection part 211 on the base substrate may be smaller than the size in the second direction Y of the orthographic projection of the second conductive part 22 on the base substrate. The orthographic projection of the first connection part 211 on the base substrate may fall on the orthographic projection of the connection part 72 on the base substrate, and this arrangement may greatly improve the transmittance rate of the display panel. In an exemplary embodiment, the size in the second direction Y of the orthographic projection of the second connection part 212 on the base substrate may be larger than the size in the second direction Y of the orthographic projection of the first connection part 211 on the base substrate in order to reduce the self-resistance of the conductive strip, which extends in the row direction, formed by the second conductive parts 22. It is to be understood that in other exemplary embodiments, the first connection part 211 may also not be provided between two second conductive parts 22 in the same repetition unit.

As shown in FIGS. 7, 12, 20, the second active layer may include an active part 8, and the active part 8 may include a first active part 81, a second active part 82, a thirteenth active part 813, a fourteenth active part 814, and a fifteenth active part 815. The first active part 81 may be used to form a channel region of the first transistor T1, the second active part 82 may be used to form a channel region of the second transistor T2, the thirteenth active part 813 is connected to an end of the first active part 81 away from the second active part 82, the fourteenth active part 814 is connected to an end of the second active part 82 away from the first active part 81, and the fifteenth active part 815 is connected between the first active part 81 and the second active part 82. The second active layer may be formed from indium gallium zinc oxide, and accordingly, the first transistor T1 and the second transistor T2 may be N-type metal oxide thin film transistors. The orthographic projection of the third gate line 2G1 on the base substrate may cover the orthographic projection of the second active part 82 on the base substrate, and a portion of the third gate line 2G1 may be used to form a bottom gate of the second transistor. The orthographic projection of the third reset signal line 2Re1 on the base substrate may cover the orthographic projection of the first active part 81 on the base substrate, and a portion of the third reset signal line 2Re1 may be used to form a bottom gate of the first transistor T1.

As shown in FIGS. 7, 13, 21, the third gate layer may include a first reset signal line 3Re1, a first gate line 3G1, and a second initial signal line Vinit2. The orthographic projection of the first reset signal line 3Re1 on the base substrate, the orthographic projection of the first gate line 3G1 on the base substrate, and the orthographic projection of the second initial signal line Vinit2 on the base substrate may all extend in the first direction X. The first reset signal line 3Re1 may be used to provide the first reset signal terminal in FIG. 1, the orthographic projection of the first reset signal line 3Re1 on the base substrate may cover the orthographic projection of the first active part 81 on the base substrate, a portion of the first reset signal line 3Re1 may be used to form a top gate of the first transistor T1, and at the same time, the first reset signal line 3Re1 may be connected to the third reset signal line 2Re1 through a via hole located in a wiring region at the edge of the display panel. The first gate line 3G1 may be used to provide the first gate driving signal terminal of FIG. 1, the orthographic projection of the first gate line 3G1 on the base substrate may cover the orthographic projection of the second active part 82 on the base substrate, and a portion of the first gate line 3G1 may be used to form the top gate of the second transistor T2, and at the same time, the first gate line 3G1 may be connected to the third gate line 2G1 through a via hole located in a wiring region at the edge of the display panel. As shown in FIGS. 7, 13, 21, in the same pixel driving circuit, the orthographic projection of the first conductive part 11 on the base substrate may be located between the orthographic projection of the first gate line 3G1 on the base substrate and the orthographic projection of the enable signal line EM on the base substrate, the orthographic projection of the first reset signal line 3Re1 on the base substrate may be located at a side of the orthographic projection of the first gate line 3G1 on the base substrate away from the orthographic projection of the first conductive part 11 on the base substrate. The orthographic projection of the second gate line G2 on the base substrate may be located between the orthographic projection of the first gate line 3G1 on the base substrate and the orthographic projection of the first reset signal line 3Re1 on the base substrate. The orthographic projection of the second initial signal line Vinit2 on the base substrate is located at the side of the orthographic projection of the enable signal line EM on the base substrate away from the orthographic projection of the first conductive part 11 on the base substrate. The orthographic projection of the second reset signal line Re2 on the base substrate may be located at the side of the orthographic projection of the second initial signal line Vinit2 on the base substrate away from the orthographic projection of the first conductive part 11 on the base substrate. The orthographic projection of the first initial signal line Vinit1 on the base substrate is located at the side of the orthographic projection of the first reset signal line 3Re1 on the base substrate away from the orthographic projection of the first conductive part 11 on the base substrate. The orthographic projections on the base substrate of the first reset signal line 3Re1 and the first initial signal line Vinit1 in the pixel driving circuits in the adjacent next row are located between the orthographic projection on the base substrate of the second reset signal line Re2 in the pixel driving circuits in the current row and the orthographic projection on the base substrate of the second initial signal line Vinit2 in the pixel driving circuits in the current row. This design may improve the integration of the pixel driving circuit. In addition, the display panel may make the second active layer conductive by using the third gate layer as a mask, i.e., a region of the second active layer covered by the third gate layer may form the channel region of the transistor, and a region thereof not covered by the third gate layer forms a conductive structure.

As shown in FIGS. 7, 14, 22, the first source-drain layer may include a first bridging part 41, a second bridging part 42, a third bridging part 43, a fourth bridging part 44, a fifth bridging part 45, a sixth bridging part 46, a data line Data, and a first initial connection line 4Vinit1. The first bridging part 41 may be connected to the eleventh active part 611 and the second conductive part 22 through via holes (black square in the figure) respectively so as to connect the first electrode of the fifth transistor T5 and the second electrode of the capacitor C. The second bridging part 42 may be connected to the first conductive part 11 and the fifteenth active part 815 through via holes respectively so as to connect the gate electrode of the driving transistor, the second electrode of the first transistor and the first electrode of the second transistor. The third bridging part 43 may be connected to the tenth active part 610 and the fourteenth active part 814 through via holes respectively so as to connect the second electrode of the second transistor and the second electrode of the driving transistor. The fourth bridging part 44 may be connected to the ninth active part 69 through a via hole so as to connect to the second electrode of the sixth transistor. The fifth bridging part 45 may be connected to the eighth active part 68 and the second initial signal line Vinit2 through via holes respectively so as to connect the second electrode of the seventh transistor and the second initial signal terminal. The orthographic projections of the data line Data and the first initial connection line 4Vinit1 on the base substrate may extend in the second direction Y. The data line Data may be used to provide the data signal terminal in FIG. 1, and the data line Data may be connected to the twelfth active part 612 through a vial hole so as to connect the first electrode of the fourth transistor and the data signal terminal. The first initial connection line 4Vinit1 is connected to the sixth bridging part 46, and the first initial connection line 4Vinit1 may be connected to the thirteenth active part 813 and the first initial signal line Vinit1 through via holes by using the sixth bridging part so as to connect the first initial signal terminal and the first electrode of the first transistor. Meanwhile, the first initial connection line 4Vinit1 and the first initial signal line Vinit1 may form a grid structure to reduce the resistance of the first initial signal line Vinit1.

As shown in FIGS. 7, 14, 22, 23, in the pixel driving circuits provided in different repetition units and adjacent in the first direction X, the orthographic projection of the data line Data on the base substrate may be located between orthographic projections of two adjacent first bridging parts 41 on the base substrate. The data line Data may include a first extension part da1, a second extension part da2 and a third extension part da3, and the second extension part da2 is connected between the first extension part da1 and the third extension part da3. In the pixel driving circuits provided in different repetition units and adjacent in the first direction X, the first extension parts da1 of two adjacent data lines are provided opposite each other in the first direction X, the second extension parts da2 of two adjacent data lines are provided opposite each other in the first direction X, and the third extension parts da3 of two adjacent data lines are provided opposite each other in the first direction X. A structure A and a structure B are provided opposite each other in the first direction, which may mean that the area covered by the orthographic projection of the structure A on the base substrate moving infinitely in the first direction and the area covered by the orthographic projection of the structure B on the base substrate moving infinitely in the first direction coincide with each other. The distance in the first direction X between the orthographic projections of two adjacent second extension parts Da2 on the base substrate is greater than the distance in the first direction X between the orthographic projections of two adjacent first extension parts Da1 on the base substrate, and the distance in the first direction X between the orthographic projections of two adjacent second extension parts Da2 on the base substrate is greater than the distance in the first direction X between the orthographic projections of two adjacent third extension parts Da3 on the base substrate. In an exemplary embodiment, the orthographic projection of at least a portion of the second extension part Da2 on the base substrate is located between the orthographic projection of the first gate line 3G1 on the base substrate and the orthographic projection of the second gate line G2 on the base substrate.

In an exemplary embodiment, the display panel further includes a light emitting unit layer and a color film layer. The light emitting unit layer includes at least a light emitting material layer, the light emitting unit layer may be provided on the side of the pixel definition layer away from the base substrate, and the light emitting unit layer includes a plurality of light emitting units. The color film layer is provided on the side of the light emitting unit layer away from the base substrate, the color film layer includes a plurality of color filtering parts, the color filtering part is provided in correspondence with the electrode part, the orthographic projection of the color filtering part on the base substrate and the orthographic projection of the corresponding electrode part on the base substrate are at least partially overlapped. In the exemplary embodiment, the color film layer is used instead of a polarizer in the related art, thereby improving the light output rate of the display panel. Among other things, the display panel may also include a common electrode layer and an encapsulation layer, the common electrode layer is provided between the light emitting unit layer and the color film layer, and the encapsulation layer is provided between the common electrode layer and the color film layer.

In an exemplary embodiment, in order to improve the resolution of the display panel, the pixel definition layer may be a black pixel definition layer. As shown in FIG. 7, the pixel definition layer is further formed with a light-transmitting hole PT. The light-transmitting hole PT is located in a light-transmitting area of the display panel and is provided in pixel driving circuits of different repetition units and adjacent to each other in the first direction, and the orthographic projection of at least a portion of the light-transmitting hole PT on the base substrate is located between the orthographic projections of two adjacent second extension parts Da2 on the base substrate, and is located between the orthographic projection of the first gate line 3G1 on the base substrate and the orthographic projection of the second gate line G2 on the base substrate. The light-transmitting area of the display panel may refer to an area of the display panel where no light shielding layer such as the blocking layer, first active layer, first gate layer, second gate layer, second active layer, third gate layer, first source-drain layer, second source-drain layer, electrode layer, and the like is provided. In an exemplary embodiment, the light-transmitting hole PT may allow light to transmit through the display panel, thereby facilitating the implementation of technologies such as an under-screen camera, fingerprint identification technology, sensing ambient light, and the like.

As shown in FIGS. 7, 15, 23, the second source-drain layer may include a power line VDD and a seventh bridging part 57. The seventh bridging part 57 may be connected to the fourth bridging part 44 through a via hole to connect to the second electrode of the sixth transistor. The orthographic projection of the power line VDD on the base substrate may extend in the second direction Y. The power line VDD is used to provide the first power signal terminal in FIG. 1. The power line VDD may be connected to the first bridging part 41 through a via hole to connect the first power supply signal terminal and the first electrode of the fifth transistor, and the second electrode of the capacitor. The power line VDD may include a fourth extension part VDD4, a fifth extension part VDD5, and a sixth extension part VDD6. The fifth extension part VDD5 is connected between the fourth extension part VDD4 and the sixth extension part VDD6. The size in the first direction X of the orthographic projection of the fifth extension part VDD5 on the base substrate may be larger than the size in the first direction X of the orthographic projection of the fourth extension part VDD4 on the base substrate, and the size in the first direction X of the orthographic projection of the fifth extension part VDD5 on the base substrate may be larger than the size in the first direction X of the orthographic projection of the sixth extension part VDD6 on the base substrate. The orthographic projection of the fifth extension part VDD5 on the base substrate may cover the orthographic projections of the first active part 81 and the second active part 82 on the base substrate, and the fifth extension part VDD5 may reduce the effect of light on the characteristics of the first transistor and the second transistor. The orthographic projection of the fifth extension part VDD5 on the base substrate may also cover the orthographic projection of the second bridging part 42 on the base substrate, and the fifth extension part VDD5 may stabilize the voltage of and shield the second bridging part 42 to reduce the voltage fluctuation of the gate electrode of the driving transistor T3 in the light emitting phase. In the same repetition unit, the fifth extension parts VDD5 in the two power lines VDD may be connected to each other, so that the power line VDD and the second conductive part 22 may form a grid structure which power line may reduce the voltage drop of the power signal thereon. In an exemplary embodiment, the interconnected fifth extension parts VDD5 may form a conductive block 5VDD.

As shown in FIGS. 7, 16, the electrode layer includes a plurality of electrode parts: a first electrode part G, a second electrode part B, and a third electrode part R. Each electrode part may be connected to the seventh bridging part 57 through a via hole to connect to the second electrode of the sixth transistor. The display panel may further include a pixel definition layer provided on the side of the electrode layer away from the base substrate, a plurality of pixel openings PH are formed in the pixel definition layer, the pixel opening PH is provided in correspondence with the electrode part, and the orthographic projection of the pixel opening PH on the base substrate coincides with the orthographic projection of the electrode part on the base substrate. The orthographic projection of the first electrode part G on the base substrate is at least partially overlapped with the orthographic projection of the data line Data on the base substrate. The orthographic projections of the second electrode part B and the third electrode part R on the base substrate may fall on the orthographic projection of the power line VDD on the base substrate, e.g., the orthographic projections of the second electrode part B and the third electrode part R on the base substrate may fall on the orthographic projection of the conductive block 5VDD on the base substrate. The first electrode part G may be used to form the electrode part of the green light emitting unit in the display panel, the second electrode part B may be used to form the electrode part of the blue light emitting unit in the display panel, and the third electrode part R may be used to form the electrode part of the red light emitting unit. Among the plurality of electrode parts connected to the pixel driving circuits in the same row, the second electrode part B, the first electrode part G, the third electrode part R, and the first electrode part G are sequentially alternately arranged in the row direction X. In the pixel driving circuits in two adjacent columns, a plurality of second electrode parts B and a plurality of third electrode parts R are connected to the pixel driving circuits in the same column, and the second electrode parts B and third electrode parts R connected to the pixel driving circuits in the same column are sequentially alternately arranged in the column direction Y, a plurality of first electrode parts G are connected to the pixel driving circuits in another column, and the first electrode parts G connected to the pixel driving circuits in the same column are spaced apart in the column direction. A minimum distance S1 in the column direction between the orthographic projections, on the base substrate, of two first electrode parts G connected to the pixel driving circuits in adjacent rows but in the same column is greater than the size S2 in the column direction of the orthographic projection of the third electrode part R on the base substrate or the size S3 in the column direction of the orthographic projection of the second electrode part B on the base substrate.

As shown in FIGS. 7, 11, and 19, a first opening 221 is formed in the second conductive part 22. The area of the first opening 221 corresponding to the green light emitting unit on the base substrate is larger than the area of the first opening 221 corresponding to the blue light emitting unit on the base substrate, and the area of the first opening 221 corresponding to the green light emitting unit on the base substrate is larger than the area of the first opening 221 corresponding to the red light emitting unit on the base substrate. This arrangement may allow the capacitance value corresponding to the green light emitting unit to be smaller than the capacitance value corresponding to the blue light emitting unit, and the capacitance value corresponding to the green light emitting unit to be smaller than the capacitance value corresponding to the red light emitting unit. Since the luminous efficiency of the green light emitting unit is high, the off voltage of the driving transistor T3 corresponding to the green light emitting unit is high. The exemplary embodiment may improve the writing speed of the data signal of the gate electrode of the driving transistor corresponding the green light emitting unit in the data writing phase by reducing the capacitance of the capacitor corresponding to the green light emitting unit, thereby reducing the voltage of the data signal required for turning off the corresponding driving transistor of the green light emitting unit.

It is to be noted that, as shown in FIGS. 3, 5, 7, 22, 23, the black square drawn on the side of the first source-drain layer away from the base substrate denotes a via hole through which the first source-drain layer is connected to the other layers on the side of the first source-drain layer facing the base substrate, the black square drawn on the side of the second source-drain layer away from the base substrate denotes a via hole through which the second source-drain layer is connected to the other layers on the side of the second source-drain layer facing the base substrate, and the black square drawn on the side of the electrode layer away from the base substrate denotes a via hole through which the electrode layer is connected to the other layers on the side of the electrode layer facing the base substrate. The black square indicates the position of the via hole, and different via holes indicated by the black squares of different positions may pass through different insulating layers.

Figure 24:
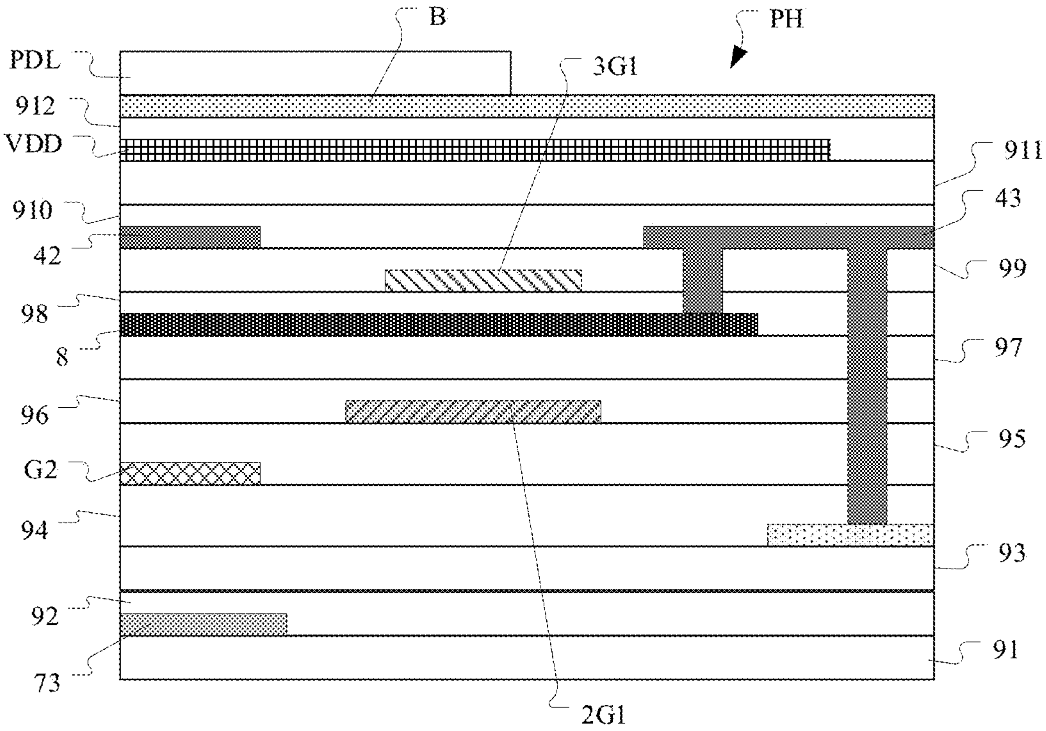
FIG. 24 is a partial sectional view of the display panel in FIG. 7 taken along the dashed line BB.

As shown in FIG. 24, a partial sectional view of the display panel in FIG. 7 taken along the dashed line BB is shown. The display panel may further include a barrier layer 92, a first buffer layer 93, a first insulating layer 94, a second insulating layer 95, a first dielectric layer 96, a second buffer layer 97, a third insulating layer 98, a second dielectric layer 99, a passivation layer 910, a first planarization layer 911, and a second planarization layer 912. The base substrate 91, the blocking layer, the barrier layer 92, the first buffer layer 93, the first active layer, the first insulating layer 94, the first gate layer, the second insulating layer 95, the second gate layer, the first dielectric layer 96, the second buffer layer 97, the second active layer, the third insulating layer 98, the third gate layer, the second dielectric layer 99, the first source-drain layer, the passivation layer 910, the first planarization layer 911, the second source-drain layer, the second planarization layer 912, the electrode layer, and the pixel-defining layer PDL are stacked in that order. The barrier layer 92 may include a silicon oxide layer; the first buffer layer 93 and the second buffer layer 97 may include one or more of a silicon oxide layer and a silicon nitride layer; the first insulating layer 94, the second insulating layer 95 and the third insulating layer 98 may include one or more of a silicon oxide layer and a silicon nitride layer; the first dielectric layer 96 and the second dielectric layer 99 may include a silicon nitride layer; the passivation layer 910 may include a silicon nitride layer; the material of the first planarization layer 911 and the second planarization layer 912 may be an organic material, such as polyimide (PI), polyethylene terephthalate (PET), polyethylene naphthalate (PEN), silicone-glass bonding structure (SOG), and other materials. The base substrate 91 may include a glass substrate, a barrier layer, and a polyimide layer stacked in that order, and the barrier layer may be an inorganic material. The first gate layer, the second gate layer, the third gate layer, the first source-drain layer, and the second source-drain layer are all conductive layers, for example, the material of the first gate layer, the second gate layer, and the third gate layer may be one of molybdenum, aluminium, copper, titanium, niobium, or an alloy thereof, or a molybdenum/titanium alloy or lamination. The material of the first source-drain layer and the second source-drain layer may include a metallic material, for example, it may be one of molybdenum, aluminium, copper, titanium, niobium, or an alloy thereof, or a molybdenum/titanium alloy or lamination, or may be a titanium/aluminium/titanium lamination. The electrode layer may include an indium tin oxide layer, a silver layer. The square resistance of any conductive layer of the first gate layer, the second gate layer, and the third gate layer may be greater than the square resistance of any conductive layer of the first source-drain layer and the second source-drain layer.

It is to be noted that the scale of the accompanying drawings in the present disclosure may be used as a reference in the actual process, but is not limited thereto, for example, the width-to-length ratio of the channel, the thicknesses and spacings of individual film layers, and the widths and spacings of individual signal lines may be adjusted according to the actual needs. The number of pixels in the display substrate and the number of sub-pixels in each pixel are also not limited to the number shown in the drawings, and the accompanying drawings depicted in the present disclosure are only illustration of the structure. In addition, the terms such as first, second or the like are only used to define the names of different structures, which do not intend to define a particular order and number. In an exemplary embodiment, the orthographic projection of a certain structure on the base substrate extends in a certain direction, which can be understood as the orthographic projection of the structure on the base substrate extends in a straight line or in a bending line in that direction. A transistor is an element that includes at least three terminals of a gate electrode, a drain electrode, and a source electrode.

The transistor has a channel region between the drain electrode (drain terminal, drain region, or drain) and the source electrode (source terminal, source region, or source), and current can flow through the drain electrode, the channel region, and the source electrode. In an exemplary embodiment, the channel region is a region through which the current mainly flows. In an exemplary embodiment, the first electrode may be a drain electrode and the second electrode may be a source electrode, or the first electrode may be a source electrode and the second electrode may be a drain electrode. In the case where transistors with opposite polarities are used, or in the case where the direction of the current in the circuit operation changes, the functions of the "source electrode" and the "drain electrode" are sometimes interchanged. Therefore, in an exemplary embodiment, the "source electrode" and the "drain electrode" may be interchanged. In addition, the gate electrode may also be referred to as a control electrode.

An exemplary embodiment also provides a display device including the display panel as described above. The display device may be for example a mobile phone, a tablet computer, a television, and the like.

Those skilled in the art may easily conceive of other embodiments of the present disclosure upon consideration of the specification and practice of the invention disclosed herein. The present disclosure is intended to cover any variations, uses, or adaptations of the present disclosure that follow the general principles of the present disclosure and include the common general knowledge or conventional technical means in the technical field not disclosed by the present disclosure. The specification and embodiments are to be regarded as exemplary only, with the true scope and spirit of the present disclosure being indicated by the following claims.

The accompanying drawings in the present disclosure relate only to the structures involved in the present disclosure, and other structures may be referred to the conventional design. In the case where there is no conflict, the embodiments and features therein of the present disclosure may be combined with each other to obtain new embodiments. Those skilled in the art may understand that modifications or equivalent substitutions may be made to the technical solutions of the present disclosure without departing from the spirit and scope of the technical solutions of the present disclosure, which all shall fall within the scope of the claims of the present disclosure.

It is to be understood that the present disclosure is not limited to the precise structure described above and illustrated in the accompanying drawings, and that various modifications and changes may be made without departing from the scope thereof. The scope of the present disclosure is limited only by the appended claims.

What is claimed is:

1. A display panel, comprising:

a base substrate;

a first source-drain layer, provided on a side of the base substrate and comprising a data line;

a second source-drain layer, provided on a side of the first source-drain layer away from the base substrate and comprising a power line;

an electrode layer, provided on a side of the second source-drain layer away from the base substrate and comprising a plurality of electrode parts; and a pixel definition layer, provided on a side of the electrode layer away from the base substrate and having a plurality of pixel openings formed therein, the pixel opening being provided in correspondence with the electrode part, and an orthographic projection of the pixel opening on the base substrate coinciding with an orthographic projection of the electrode part on the base substrate, wherein the orthographic projections of at least some of the plurality of the electrode parts on the base substrate are at least partially overlapped with an orthographic projection of the data line on the base substrate.

2. The display panel according to claim 1, further comprising:

a first planarization layer, provided between the first source-drain layer and the second source-drain layer; and a second planarization layer, provided between the second source-drain layer and the electrode layer.

3. The display panel according to claim 1, further comprising a green light emitting unit, wherein the plurality of electrode parts comprise a first electrode part configured to form a first electrode of the green light emitting unit, and an orthographic projection of the first electrode part on the base substrate is at least partially overlapped with the orthographic projection of the data line on the base substrate.

4. The display panel according to claim 3, further comprising a blue light emitting unit and a red light emitting unit, wherein the electrode layer further comprises:

a second electrode part, configured to form a first electrode of the blue light emitting unit, an orthographic projection of the second electrode part on the base substrate falling on an orthographic projection of the power line on the base substrate; and a third electrode part, configured to form a first electrode of the red light emitting unit, an orthographic projection of the third electrode part on the base substrate falling on the orthographic projection of the power line on the base substrate.

5. The display panel according to claim 1, further comprising a green light emitting unit, a blue light emitting unit, and a red light emitting unit, wherein the plurality of electrode parts comprises:

a first electrode part, configured to form a first electrode of the green light emitting unit, an orthographic projection of the first electrode part on the base substrate falling on an orthographic projection of the power line on the base substrate;

a second electrode part, configured to form a first electrode of the blue light emitting unit, an orthographic projection of the second electrode part on the base substrate being at least partially overlapped with an orthographic projection of the data line on the base substrate; and a third electrode part, configured to form a first electrode of the red light emitting unit, an orthographic projection of the third electrode part on the base substrate being at least partially overlapped with the orthographic projection of the data line on the base substrate.

6. The display panel according to claim 1, comprising a plurality of repetition units arranged in an array in a first direction and a second direction intersection with the first direction, wherein the repetition unit comprises two pixel driving circuits arranged in the first direction, and the two pixel driving circuits in a same repetition unit are provided in mirror symmetry.

7. The display panel according to claim 6, wherein the pixel driving circuit comprises a driving transistor and a fifth transistor, and a second electrode of the fifth transistor is connected to a first electrode of the driving transistor, the first source-drain layer further comprises:

a first bridging part, connected to a first electrode of the fifth transistor and connected to the power line through a via hole; and in pixel driving circuits provided in different repetition units and adjacent in the first direction, the orthographic projection of the data line on the base substrate is located between orthographic projections of two adjacent first bridging parts on the base substrate.

8. The display panel according to claim 6, wherein the orthographic projection of the data line on the base substrate extends in the second direction, the data line comprises a first extension part, a second extension part and a third extension part, and the second extension part is connected between the first extension part and the third extension part, in pixel driving circuits located in different repetition units and adjacent in the first direction, the first extension parts of two adjacent data lines are provided opposite each other in the first direction, the second extension parts of the two adjacent data lines are provided opposite each other in the first direction, and the third extension parts of the two adjacent data lines are provided opposite each other in the first direction, a distance, in the first direction, between orthographic projections of two adjacent second extension parts on the base substrate is greater than a distance, in the first direction, between orthographic projections of two adjacent first extension parts on the base substrate, and the distance, in the first direction, between the orthographic projections of the two adjacent second extension parts on the base substrate is greater than a distance, in the first direction, between orthographic projections of two adjacent third extension parts on the base substrate.

9. The display panel according to claim 8, wherein the pixel driving circuit further comprises a driving transistor, a second transistor, a fourth transistor, a first electrode of the second transistor is connected to a gate electrode of the driving transistor, a second electrode of the second transistor is connected to a second electrode of the driving transistor, a first electrode of the fourth transistor is connected to the data line, and a second electrode of the fourth transistor is connecting to a first electrode of the driving transistor, the display panel further comprises:

a first gate line, an orthographic projection of the first gate line on the base substrate extending in the first direction, and a portion of the first gate line being configured to form a gate electrode of the second transistor; and a second gate line, an orthographic projection of the second gate line on the base substrate extending in the first direction, and a portion of the second gate line being configured to form a gate electrode of the fourth transistor, an orthographic projection of a portion of the second extension part on the base substrate is located between an orthographic projection of the first gate line on the base substrate and an orthographic projection of the second gate line on the base substrate.

10. The display panel according to claim 9, wherein the pixel definition layer is a black pixel definition layer, the pixel definition layer is further provided with a light-transmitting hole, the light-transmitting hole is provided in a light-transmitting area of the display panel and is provided in the pixel driving circuits of different repetition units and adjacent to each other in the first direction, and an orthographic projection of at least a portion of the light-transmitting hole on the base substrate is located between the orthographic projections of the two adjacent second extension parts on the base substrate, and is located between the orthographic projection of the first gate line on the base substrate and the orthographic projection of the second gate line on the base substrate.

11. The display panel according to claim 6, wherein the first direction is a row direction, the second direction is a column direction, and the pixel driving circuits in each column are provided corresponding to one power line, and an orthographic projection of the power line on the base substrate extends in the column direction, the power line comprises a fourth extension part, a fifth extension part, a sixth extension part, and the fifth extension part is connected between the fourth extension part and the sixth extension part, a size, in the row direction, of an orthographic projection of the fifth extension part on the base substrate is greater than a size, in the row direction, of an orthographic projection of the fourth extension part on the base substrate, and is greater than a size, in the row direction, of an orthographic projection of the sixth extension part on the base substrate, in the same repetition unit, the extension parts of two adjacent power lines are connected to each other, and two connected fifth extension parts form a conductive block, and orthographic projections of at least some of the plurality of electrode parts on the base substrate are overlapped with the orthographic projection of the power line on the base substrate, and the orthographic projection of the electrode part, overlapped with the power line, on the base substrate falls on an orthographic projection of the conductive block on the base substrate.

12. The display panel according to claim 1, further comprising a pixel driving circuit and a light emitting unit, wherein the pixel driving circuit is configured to drive the light emitting unit to emit light, the pixel driving circuit comprises a driving transistor, a capacitor, a first electrode of the capacitor is connected to a gate electrode of the driving transistor, and a second electrode of the capacitor is connected to the power line, the light emitting unit comprises a red light emitting unit, a green light emitting unit, and a blue light emitting unit, a capacitance of the capacitor in the pixel driving circuit corresponding to the green light emitting unit is smaller than a capacitance of the capacitor in the pixel driving circuit corresponding to the blue light emitting unit, and the capacitance of the capacitor in the pixel driving circuit corresponding to the green light emitting unit is smaller than a capacitance of the capacitor in the pixel driving circuit corresponding to the red light emitting unit.

13. The display panel according to claim 12, wherein the pixel driving circuit further comprises a second transistor, and a first electrode of the second transistor is connected to the gate electrode of the driving transistor, the display panel further comprises:

a first gate layer, provided between the base substrate and the first source-drain layer, and comprising a first conductive part, the first conductive part being configured to form the first electrode of the capacitor and the gate electrode of the driving transistor; and a second gate layer, provided between the first gate layer and the first source-drain layer, and comprising a second conductive part, an orthographic projection of the second conductive part on the base substrate being at least partially overlapped with an orthographic projection of the first conductive part on the base substrate, and the second conductive part being configured to form the second electrode of the capacitor, wherein a first opening is formed in the second conductive part, the first source-drain layer further comprises:

a second bridging part, connected to the first electrode of the second transistor, and connected to the first conductive part through a via hole passing through the first opening, wherein an area of an orthographic projection, on the base substrate, of the first opening in the pixel driving circuit corresponding to the green light emitting unit is greater than an area of an orthographic projection, on the base substrate, of the first opening in the pixel driving circuit corresponding to the red light emitting unit, the area of the orthographic projection, on the base substrate, of the first opening in the pixel driving circuit corresponding to the green light emitting unit is greater than an area of an orthographic projection, on the base substrate, of the first opening in the pixel driving circuit corresponding to the blue light emitting unit.

14. The display panel according to claim 1, further comprising:

a light emitting unit layer, provided on a side of the pixel definition layer away from the base substrate, and comprising a plurality of light emitting units; and a color film layer, provided on a side of the light emitting unit layer away from the base substrate, and comprising a plurality of color filtering parts, the color filtering part being provided in correspondence with the electrode part, and an orthographic projection of the color filtering part on the base substrate being at least partially overlapped with an orthographic projection of a corresponding electrode part on the base substrate.

15. The display panel according to claim 1, further comprising a pixel driving circuit, wherein the pixel driving circuit comprises a driving transistor and a first transistor, a second electrode of the first transistor is connected to a gate electrode of the driving transistor, and a first electrode of the first transistor is connected to a first initial signal line, the display panel further comprises:

a first gate layer;

a second active layer; and a second gate layer, provided between the first gate layer and the second active layer, and comprising the first initial signal line, an orthographic projection of the first initial signal line on the base substrate extending in a first direction, the first source-drain layer further comprises a first initial connection line, and an orthographic projection of the first initial connection line on the base substrate extends in a second direction intersecting the first direction, the first initial connection line and the first initial signal line, which orthographic projections on the base substrate are overlapped, are connected with each other via a via hole.

16. The display panel according to claim 1, further comprising a pixel driving circuit and a light emitting unit, wherein the pixel driving circuit is configured to drive the light emitting unit to emit light, and the pixel driving circuit comprises:

a driving transistor;

a first transistor, having a first electrode connected to a first initial signal line and a second electrode connected to a gate electrode of the driving transistor;

a second transistor, having a first electrode connected to the gate electrode of the driving transistor and a second electrode connected to a second electrode of the driving transistor;

a fourth transistor, having a first electrode connected to the data line, and a second electrode connected to a first electrode of the driving transistor;

a fifth transistor, having a first electrode connected to the power line, and a second electrode connected to the first electrode of the driving transistor;

a sixth transistor, having a first electrode connected to the second electrode of the driving transistor, and a second electrode connected to the electrode part, the electrode part being configured to form a first electrode of the light emitting unit;

a seventh transistor, having a first electrode connected to a second initial signal line, and a second electrode connected to the electrode part; and a capacitor, having a first electrode connected to the gate electrode of the driving transistor and a second electrode connected to the power line.

17. The display panel according to claim 16, further comprising:

a first active layer, provided between the base substrate and the first source-drain layer, and comprising a third active part, a fourth active part, a fifth active part, a sixth active part, and a seventh active part, wherein the third active part is configured to form a channel region of the driving transistor, the fourth active part is configured to form a channel region of the fourth transistor, the fifth active part is configured to form a channel region of the fifth transistor, the sixth active part is configured to form a channel region of the sixth transistor, and the seventh active part is configured to form a channel region of the seventh transistor;

a first gate layer, provided between the first active layer and the first source-drain layer, and comprising a second reset signal line, a second gate line, an enable signal line, a first conductive part, orthographic projections of the second reset signal line, the second gate line, and the enable signal line on the base substrate extending in a first direction, wherein the first conductive part is configured to form the gate electrode of the driving transistor and the first electrode of the capacitor, a portion of the second gate line is configured to form a gate electrode of the fourth transistor, a portion of the second reset signal line is configured to form a gate electrode of the seventh transistor, and a portion of the enable signal line is configured to form gate electrodes of the fifth transistor and the sixth transistor, respectively.

18. The display panel according to claim 17, further comprising:

a second active layer, provided between the first gate layer and the first source-drain layer, and comprising a first active part and a second active part, the first active part being configured to form a channel region of the first transistor, and the second active part being configured to form a channel region of the second transistor; and a third gate layer, provided between the second active layer and the first source-drain layer, and comprising the first gate line and a first reset signal line, orthographic projections of the first gate line and the first reset signal line on the base substrate extending in the first direction, a portion of the first gate line is configured to form a top gate of the second transistor, and a portion of the first reset signal line is configured to form a top gate of the first transistor.

19. The display panel according to claim 18, wherein the third gate layer further comprises the second initial signal line, and the second gate layer further comprises the first initial signal line, orthographic projections of the first initial signal line and the second initial signal line on the base substrate extends in the first direction, in a same pixel driving circuit, the orthographic projections of the first initial signal line, the first reset signal line, the second gate line, the first gate line, the first conductive part, the enable signal line, the second initial signal line, and the second reset signal line on the base substrate are sequentially arranged in a second direction intersecting the first direction, the second gate line in a current row of the pixel driving circuits is reused as the second reset signal line in a previous row of the pixel driving circuits, and orthographic projections, on the base substrate, of the first initial signal line and the first reset signal line in an adjacent next row of the pixel driving circuits are located between the orthographic projections, on the base substrate, of the second initial signal line and the second reset signal line in the current row of the pixel driving circuits.

20. The display panel according to claim 1, further comprising a pixel driving circuit and a light emitting unit, wherein the pixel driving circuit is configured to drive the light emitting unit to emit light;

the electrode part is configured to form a first electrode of the light emitting unit, and the plurality of electrode parts comprise a first electrode part, a second electrode part, and a third electrode part, among a plurality of electrode parts connected to pixel driving circuits in a same row, the second electrode part, the first electrode part, the third electrode part, and the first electrode part are sequentially alternately arranged in a row direction, and in pixel driving circuits in two adjacent columns, a plurality of second electrode parts and a plurality of third electrode parts are connected to pixel driving circuits in a same column, the second electrode part and the third electrode part connected to the pixel driving circuits in the same column are sequentially alternately arranged in the column direction, a plurality of first electrode parts are connected to pixel driving circuits in another column, the first electrode parts connected to the pixel driving circuits in the same column are spaced apart in the column direction.

* * * * *